United States Patent
Kawai et al.

(10) Patent No.: US 9,535,433 B2
(45) Date of Patent: Jan. 3, 2017

(54) CONTROL DEVICE, HEATING DEVICE CONTROL SYSTEM, CONTROL METHOD, PROGRAM, AND RECORDING MEDIUM

(75) Inventors: Wakahiro Kawai, Shiga (JP); Takafumi Bessho, Osaka (JP)

(73) Assignee: OMRON Corporation, Kyoto (JP)

( * ) Notice: Subject to any disclaimer, the term of this patent is extended or adjusted under 35 U.S.C. 154(b) by 453 days.

(21) Appl. No.: 14/123,805

(22) PCT Filed: Aug. 23, 2011

(86) PCT No.: PCT/JP2011/068939
§ 371 (c)(1),
(2), (4) Date: Dec. 27, 2013

(87) PCT Pub. No.: WO2013/001659
PCT Pub. Date: Jan. 3, 2013

(65) Prior Publication Data
US 2014/0129045 A1    May 8, 2014

(30) Foreign Application Priority Data
Jun. 28, 2011 (JP) ................. 2011-143497

(51) Int. Cl.
*F27D 1/00* (2006.01)
*G05D 23/19* (2006.01)
(Continued)

(52) U.S. Cl.
CPC ............. *G05D 23/19* (2013.01); *B23K 1/008* (2013.01); *F27B 9/20* (2013.01); *F27D 21/0014* (2013.01);
(Continued)

(58) Field of Classification Search
CPC ............ G05D 23/19; B23K 1/008; F27B 9/20; F27D 21/0014; F27D 2019/0003; H05K 3/3494
See application file for complete search history.

(56) References Cited

U.S. PATENT DOCUMENTS 5,674,756 A * 10/1997 Satoh ................. H01L 21/3225
257/E21.321
7,809,465 B2 * 10/2010 Yamaguchi ............ B23K 1/008
218/8
(Continued)

FOREIGN PATENT DOCUMENTS

JP      2-263570 A    10/1990
JP      7-212027 A     8/1995
(Continued)

OTHER PUBLICATIONS

Takahashi, Hironobu, Heater Starting Method for Reflowing Device, JPO, Translation of JP07-212027.*
(Continued)

*Primary Examiner* — Robert Fennema
*Assistant Examiner* — Tri T Nguyen
(74) *Attorney, Agent, or Firm* — Osha Liang LLP

(57) ABSTRACT

A control device that controls a heating device having a plurality of heating zones, has a monitoring unit configured to monitor a temperature of at least a first heating zone in the plurality of heating zones, and a control unit configured to perform heat-up starting control, in which heat-up of at least a second heating zone is started in the plurality of heating zones, based on the temperature of the first heating zone.

18 Claims, 15 Drawing Sheets

(51) Int. Cl.
  *B23K 1/008*  (2006.01)
  *H05K 3/34*  (2006.01)
  *F27D 21/00*  (2006.01)
  *F27B 9/20*  (2006.01)
  *F27D 19/00*  (2006.01)

(52) U.S. Cl.
  CPC ..... *H05K 3/3494* (2013.01); *F27D 2019/0003* (2013.01)

(56) References Cited

U.S. PATENT DOCUMENTS

| | | | | |
|---|---|---|---|---|
| 8,874,254 | B2* | 10/2014 | Iwanaga | H01L 21/67103 219/405 |
| 2008/0255683 | A1* | 10/2008 | Takahashi | G05D 23/1935 700/42 |
| 2008/0257879 | A1* | 10/2008 | Huskamp | B22F 3/1055 219/494 |
| 2009/0095731 | A1* | 4/2009 | Asakura | C23C 16/4586 219/438 |

FOREIGN PATENT DOCUMENTS

| | | | |
|---|---|---|---|
| JP | 07212027 A | * | 8/1995 |
| JP | 2885047 B2 | | 4/1999 |
| JP | 2004-9099 A | | 1/2004 |
| JP | 2005-125340 A | | 5/2005 |

OTHER PUBLICATIONS

International Search Report for corresponding International Application No. PCT/JP2011/068939, mailed Nov. 29, 2011 (4 pages).

\* cited by examiner

Fig. 8

| Identification number | Reference zone | Threshold | Heat-up target zone | Changed target temperature |
|---|---|---|---|---|
| 1 | Heating zone B | T1 | Heating zone A | — |
| 2 | Heating zone B | T2 | Heating zone C | — |
| 3 | Heating zone A | T3 | Heating zone B | Tb2 |

| Identification number | Reference zone | Target temperature of reference zone | Heat-up target zone | Target temperature of heat-up target zone |
|---|---|---|---|---|
| 1 | Heating zone B | Tb | Heating zone A | Ta |
| 2 | Heating zone B | Tb | Heating zone C | Tc |

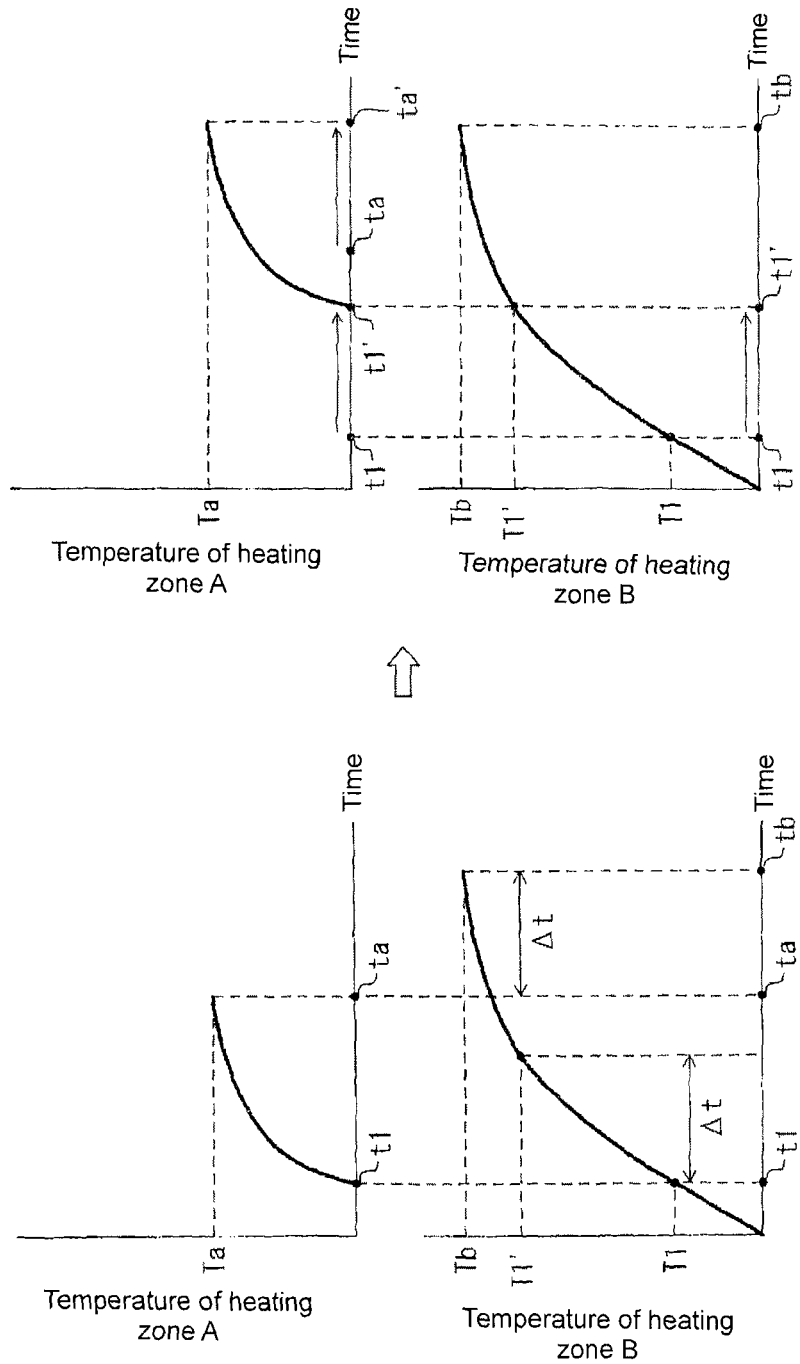

CONTROL DEVICE, HEATING DEVICE CONTROL SYSTEM, CONTROL METHOD, PROGRAM, AND RECORDING MEDIUM

BACKGROUND

Technical Field

The present invention relates to control of a heating device including a plurality of heating zones.

Related Art

Conventionally, in a reflow device that is used in soldering when an electronic component is mounted on a surface of a printed circuit board, in order to heat the printed circuit board with a predetermined temperature profile, the printed circuit board is conveyed through a plurality of series-connected heating zones having different temperatures using a conveyer. A temperature controller performs on/off control of a heater provided in each heating zone, thereby adjusting the temperature of each heating zone.

In the reflow device, generally the heaters and the temperature controllers of all the heating zones are simultaneously powered on to separately heat up the heating zones to different setting temperatures. Therefore, until the temperature of the heating zone having the higher setting temperature is stabilized, powers of other heating zones are wasted for the purpose of temperature control.

For example, Patent Document 1 discloses a technology for reducing a total current of the heaters during a heat-up process by shifting a heat-up starting time of the heater in each heating zone. In the technology, the temperature to which the heating zone can be heated up in a predetermined time is previously measured in each heater, and the heat-up starting time of each heater is set by the measured value.

Patent Document 1: Japanese Patent No. 2885047 (issued Apr. 19, 1999)

SUMMARY

The technology disclosed in Patent Document 1 is based on a premise that a fluctuation in heat-up time is small. However, possibly the heat-up time fluctuates actually due to various factors. For example, the heat-up time shortens in the case that residual heat of previous usage remains. The heat-up time also fluctuates when the temperature of a surrounding environment changes depending on seasons. Additionally, the heat-up time lengthens in the case that the heater has degraded. Even if the factor that fluctuates the heat-up time is generated, activation is started at an activation starting time, which is set before the heat-up time is fluctuated, in the technology disclosed in Patent Document 1. Accordingly, even after the temperature of a first heating zone is stabilized, a second heating zone is not stabilized yet. Therefore, the power is consumed wastefully in the first heating zone until the second heating zone is stabilized.

One or more embodiments of the present invention provides a control device, a heating device control system, a control method, a program, and a recording medium, in which the generation of the wasted power consumption can be reduced even if the factor related to the fluctuation in heat-up time is generated in the heating device in which the heat-up starting time is set in each heating zone.

In accordance with one or more embodiments of the present invention, in a control device that controls a heating device including a plurality of heating zones, the control device includes: a monitoring unit configured to monitor a temperature of at least a first heating zone in the plurality of heating zones; and a control unit configured to perform heat-up starting control, in which heat-up of at least a second heating zone is started in the plurality of heating zones, based on the temperature of the first heating zone.

In accordance with one or more embodiments of the present invention, in a control method for controlling a heating device including a plurality of heating zones, the control method includes the steps of: monitoring a temperature of at least a first heating zone in the plurality of heating zones; and performing heat-up starting control, in which heat-up of at least a second heating zone is started in the plurality of heating zones, based on the temperature of the first heating zone.

According to the control device according to one or more embodiments of the present invention, the generation of the wasted power consumption can be reduced even if the factor related to the fluctuation in heat-up time is generated in the heating device in which the heat-up starting time is set in each heating zone.

BRIEF DESCRIPTION OF THE DRAWINGS

FIG. 8 illustrates an example of the information stored in a heat-up starting condition storage unit included in a control device according to a second embodiment.

FIGS. 15(a) and 15(b) are graphs illustrating the temperature changes of heating zones A and B before and after the threshold update processing in a modification of the third embodiment.

DETAILED DESCRIPTION

Figure 1:
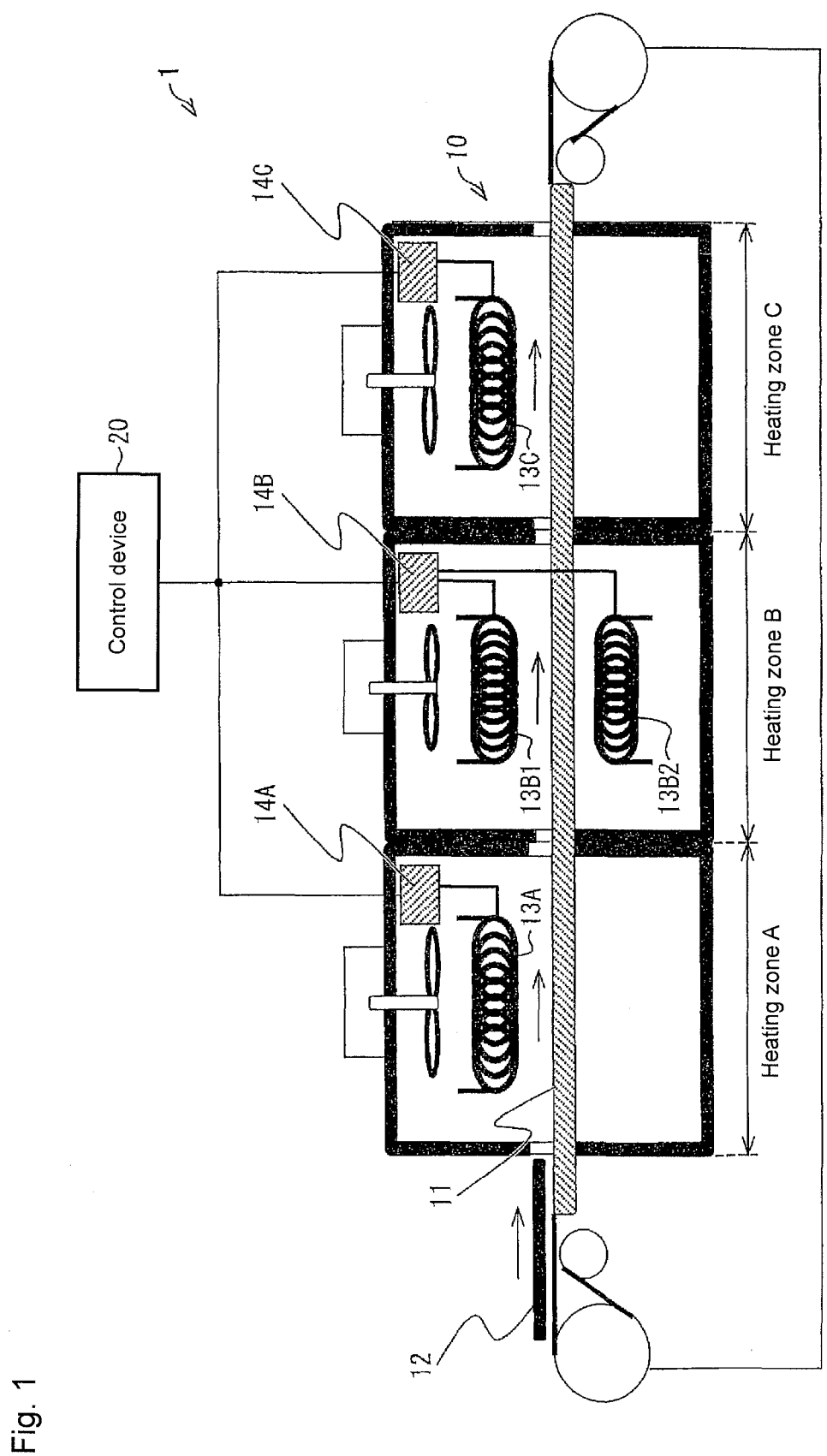
FIG. 1 is a schematic diagram illustrating a schematic configuration of a heating device control system according to one or more embodiments of the present invention.

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. FIG. 1 is a schematic diagram illustrating a schematic configuration of a heating device control system according to a first embodiment of the present invention.

(Configuration of Heating Device Control System)

The heating device control system 1 of the first embodiment includes a heating device 10 that heats a target object and a control device 20 that controls a heat-up starting time of the heating device 10. The heating device 10 and the control device 20 are connected to each other so as to be able to conduct communication with each other. In FIG. 1, the heating device 10 and the control device 20 are separately configured. Alternatively, the control device 20 may be incorporated in the heating device 10.

The heating device 10 includes heating zones A to C that are continuously disposed in series and a conveyer 11. The conveyer 11 conveys a workpiece 12, which is of the target object, such that the workpiece 12 passes sequentially through the heating zones A to C.

It is assumed that the workpiece 12 is a printed circuit board, and that the heating device 10 is a reflow device that solders an electronic component onto the printed circuit board. However, the heating device of the present invention is not limited to the reflow device, but the heating device can be applied to any device that includes a plurality of heating zones where the target object is heated. Examples of the heating device according to one or more embodiments of the present invention include a sintering device that sinters ceramics and a baking device that bakes an electrode. In one or more embodiments of the present invention, the sequentially-disposed plurality of heating zones are not necessarily disposed in the continuous manner. That is, a non-heating zone may be disposed between a certain heating zone and the subsequent heating zone.

Each heating zone includes a heater and a temperature controller that adjusts the temperature of the heating zone concerned. That is, the heating zone A includes a heater 13A and a temperature controller 14A, the heating zone B includes heaters 13B1 and 13B2 and a temperature controller 14B, and the heating zone C includes a heater 13C and a temperature controller 14C.

Figure 2:
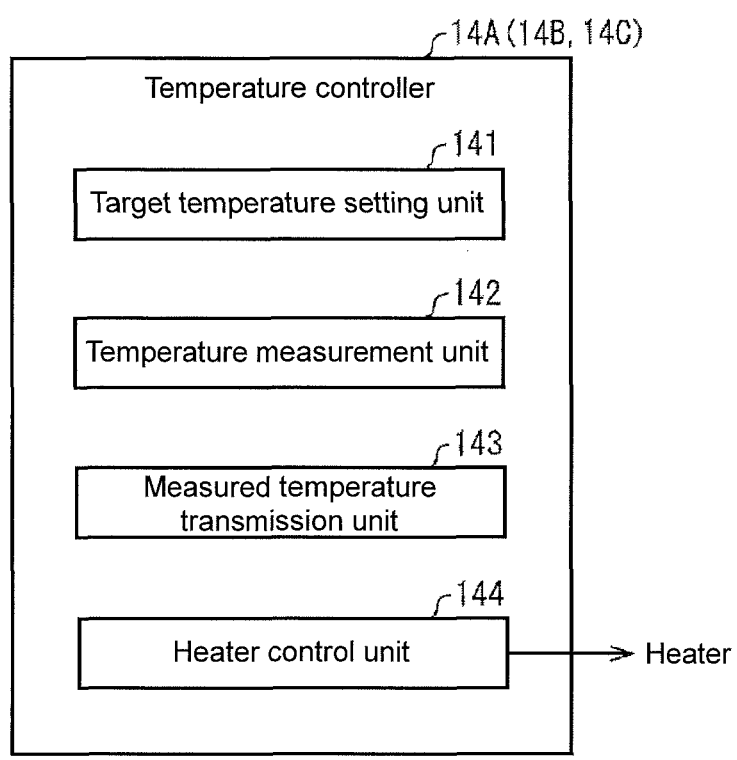
FIG. 2 is a block diagram illustrating a schematic configuration of a temperature controller included in the heating device in FIG. 1.

FIG. 2 is a block diagram illustrating a configuration of the temperature controller 14A. The temperature controllers 14B and 14C have the configuration similar to that of the temperature controller 14A. The temperature controllers 14A to 14C include a target temperature setting unit 141, a temperature measurement unit 142, a measured temperature transmission unit 143, and a heater control unit 144.

The target temperature setting unit 141 sets a target temperature (the setting temperature) of the heating zone installed. The target temperature setting unit 141 receives an input of the temperature from a worker, and sets the received temperature as the target temperature. The target temperature setting unit 141 may update the target temperature in response to an instruction from the control device 20.

The temperature measurement unit 142 measures the temperature near a passage of the workpiece 12 in the heating zone at predetermined time intervals (for example, time intervals of 1 second). The measured temperature transmission unit 143 transmits the measured temperature to the control device 20 every time the temperature measurement unit 142 measures the temperature. The measured temperature transmission unit 143 may transmit a measurement clock time to the control device 20 together with the measured temperature.

The heater control unit 144 controls a power supplied from a power supply to the heater 13A such that the measured temperature measured by the temperature measurement unit 142 is identical to the target temperature set by the target temperature setting unit 141.

Specifically, when receiving a start-up instruction, the heater control unit 144 switches from off to on the power supply to the heater 13A to start heat-up of the heating zone A. The heater control unit 144 performs the heat-up of the heating zone A until the measured temperature measured by the temperature measurement unit 142 reaches the target temperature set by the target temperature setting unit 141. Then the heater control unit 144 supplies the power to the heater 13A such that the measured temperature is stabilized around the target temperature.

The heater control unit 144 increases the amount of power supplied to the heater 13A to start the heat-up of the heating zone A, in the case that the target temperature setting unit 141 updates the target temperature to the higher temperature while the measured temperature is stabilized around the target temperature. The heater control unit 144 performs the heat-up of the heating zone A until the measured temperature reaches the new target temperature, and the heater control unit 144 supplies the power to the heater 13A such that the measured temperature is stabilized around the new target temperature.

Figure 3:
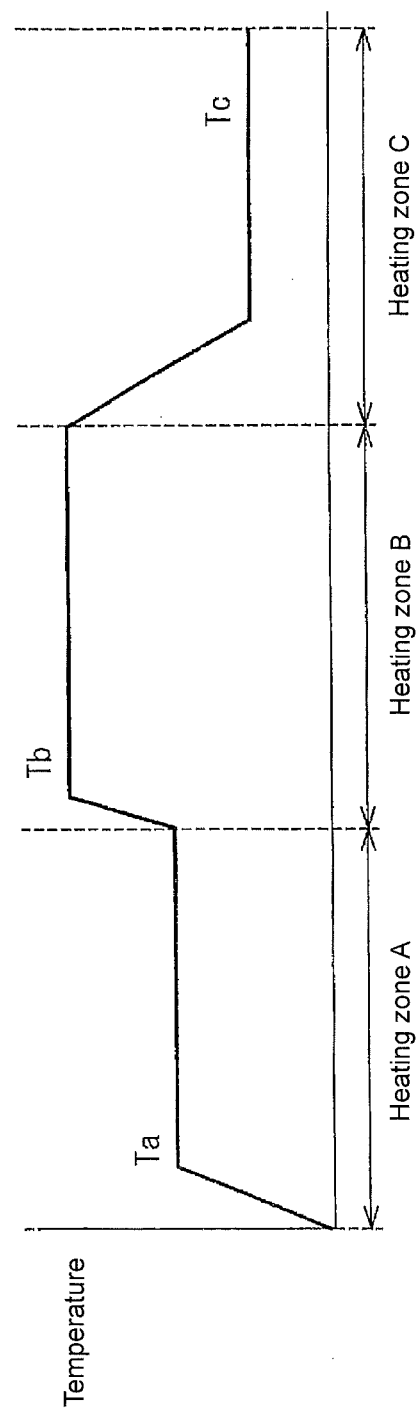
FIG. 3 illustrates a temperature profile of the heating device in FIG. 1.

For example, a temperature profile in FIG. 3 is obtained in the case that the measured temperatures of the heating zones A, B, and C are stabilized around the target temperatures by the temperature controllers 14A to 14C, respectively, while the target temperatures of the heating zones A to C are set to Ta, Tb, and Tc (Tc<Ta<Tb (Tb is a melting point of the solder)), respectively. In this case, when the workpiece 12 is carried in the heating device 10, at first the printed circuit board is previously heated at the temperature Ta in the heating zone A, and then the solder on the printed circuit board is melted at the temperature Tb in the heating zone B. Finally, the temperature is decreased to the temperature Tc in the heating zone C to mount the electronic component on the printed circuit board by the solder.

(Configuration of Control Device)

Figures 4, 5:
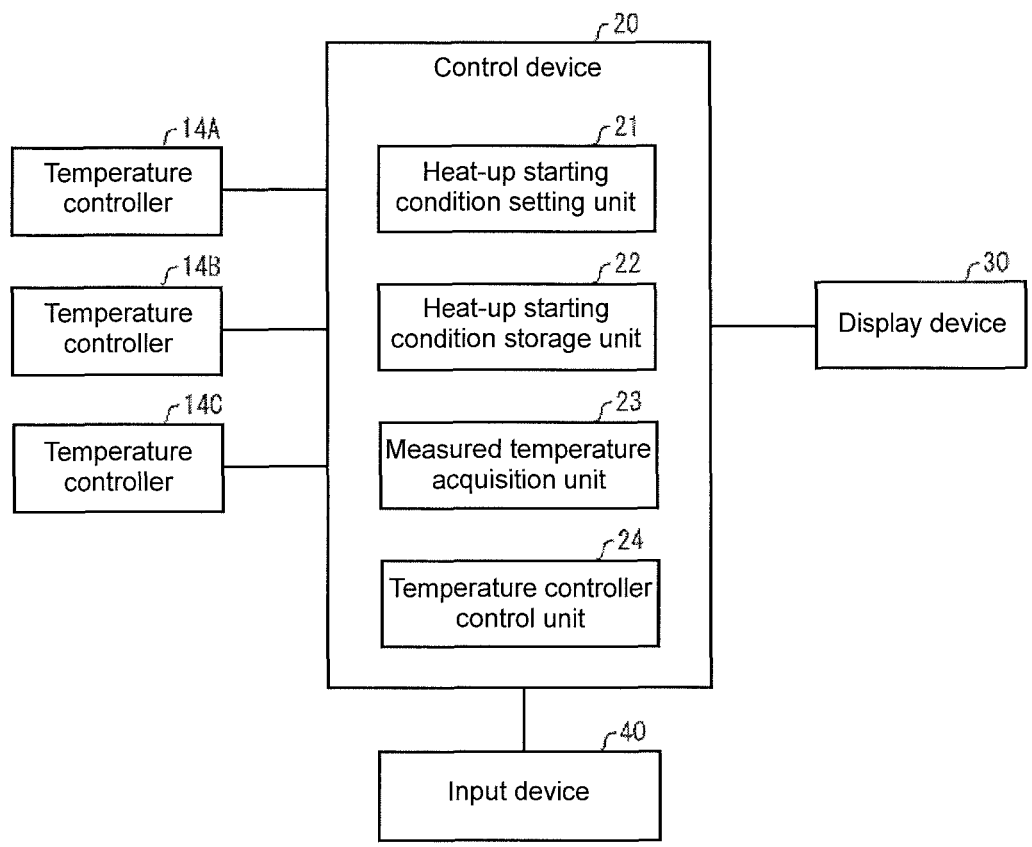
FIG. 4 is a block diagram illustrating a schematic configuration of a control device according to a first embodiment.
FIG. 5 illustrates an example of information stored in a heat-up starting condition storage unit included in the control device in FIG. 4.

The control device will be described below with reference to FIG. 4. FIG. 4 is a block diagram illustrating a schematic configuration of the control device 20.

The control device 20 is an information processing device that controls each of the temperature controllers 14A to 14C included in the heating zones A to C of the heating device 10, and the control device 20 is connected to a display device 30 and an input device 40.

For example, the control device 20 is constructed by a PC (Personal Computer)-based computer. The computer executes a program to perform control processing in the control device 20. For example, the program is recorded in a removable medium such as a CD-ROM (Compact Disc Read Only Memory). The control device 20 may use the program by reading the program from the removable medium (the computer-readable recording medium). The control device 20 may use the program by reading the program installed in a hard disk (the computer-readable recording medium) and the like. The detailed control processing performed by the control device 20 is described later.

The display device 30 is a display unit such as an LCD (Liquid Crystal Display), a PDP (Plasma Display Panel), and an organic EL (electroluminescence) display, and the display device 30 performs display output of various pieces of information such as a character and an image based on display data received from the control device 20.

The input device 40 receives various inputs from the worker of the heating device 10, and is constructed by a pointing device such as an input button, a keyboard, and a mouse and other input devices. The input device 40 converts the information input from an operator into input data, and transmits the input data to the control device 20.

Next, detailed control processing performed by the control device 20 will be described. As illustrated in FIG. 4, the control device 20 includes a heat-up starting condition setting unit 21, a heat-up starting condition storage unit 22, a measured temperature acquisition unit (the monitoring unit) 23 and a temperature controller control unit (the control unit) 24.

In response to the input to the input device 40 from the worker, the heat-up starting condition setting unit 21 sets a condition (the heat-up starting condition) for starting the heat-up of at least one heating zone, and stores the information indicating the set heat-up starting condition in the heat-up starting condition storage unit 22.

The heat-up starting condition includes the heating zone (hereinafter referred to as a reference zone (the first heating zone)) serving as a reference target, a threshold, and the heating zone (hereinafter referred to as a heat-up target zone (the second heating zone)) serving as a heat-up target. The information indicating the heat-up starting condition means condition information in which the information indicating the reference zone, the threshold, and the information indicating the heat-up target zone are correlated with one another.

FIG. 5 illustrates an example of the information stored in the heat-up starting condition storage unit 22. As illustrated in FIG. 5, the heat-up starting condition storage unit 22 stores the condition information in which an identification number "1", a reference zone "heating zone B", a threshold "T1", and a heat-up target zone "heating zone A" are correlated with one another and the condition information in which an identification number "2", a reference zone "heating zone B", a threshold "T2", and a heat-up target zone "heating zone C" are correlated with one another. As used herein, the identification number means the information identifying the condition information.

The measured temperature acquisition unit 23 monitors the temperatures at the heating zones A to C, and receives the measured temperatures from the temperature controllers 14A to 14C every time the temperature measurement unit 142 installed in each heating zone measures the temperature. The measured temperature acquisition unit 23 may acquire the measurement clock time together with the measured temperature.

The temperature controller control unit 24 performs heat-up starting control to at least one temperature controller based on the condition information stored in the heat-up starting condition storage unit 22 and the measured temperature acquired by the measured temperature acquisition unit 23.

Specifically, the temperature controller control unit 24 reads all the pieces of condition information from the heat-up starting condition storage unit 22, and determines the reference zone and the threshold indicated by each piece of condition information. The temperature controller control unit 24 performs reaching determination processing. In the reaching determination processing, the measured temperature acquired by the measured temperature acquisition unit 23 from the measured temperature transmission unit 143 of the temperature controller installed in the determined reference zone is compared to the determined threshold, and whether the temperature of the reference zone reaches the threshold is determined. When determining that the measured temperature of the reference zone reaches the threshold, the temperature controller control unit 24 determines the heat-up target zone corresponding to the threshold based on the condition information, and outputs the start-up instruction to the temperature controller of the determined heat-up target zone.

For example, the following methods (a) to (c) are conceivable as the reaching determination processing method performed by the temperature controller control unit 24.

Method (a): the determination that the temperature of the reference zone reaches the threshold is made when the measured temperature acquired by the measured temperature acquisition unit 23 from the measured temperature transmission unit 143 installed in the reference zone indicates the threshold or more.

Method (b): the determination that the temperature of the reference zone reaches the threshold is made when the temperature acquired by the measured temperature acquisition unit 23 from the measured temperature transmission unit 143 installed in the reference zone indicates a predetermined temperature range (for example, a range of threshold±1° C.) including the threshold.

Method (c): the determination that the temperature of the reference zone reaches the threshold is made when all the measured temperatures, which are continuously acquired at predetermined frequencies (for example, 10 frequencies) by the measured temperature acquisition unit 23 from the measured temperature transmission unit 143 installed in the reference zone, indicate the predetermined temperature range (for example, the range of threshold±1° C.) including the threshold.

Various temperature controllers differ from one another in temperature adjustment performance. In some temperature controllers, there is such a large overshoot that the temperature is stabilized around the target temperature after a while once the temperature exceeds the target temperature. In some temperature controllers, the temperature is stabilized around the target temperature without generating the overshoot. According to one or more embodiments of the present invention, the method (c) is selected for the temperature controller having the large overshoot, and the method (a) or (b) may be selected for the temperature controller having the small overshoot. Thus, there is no particular limitation to the reaching determination processing performed by the temperature controller control unit 24, but the reaching determination processing may properly be changed in consideration of the performance of the temperature controller.

Figure 6:
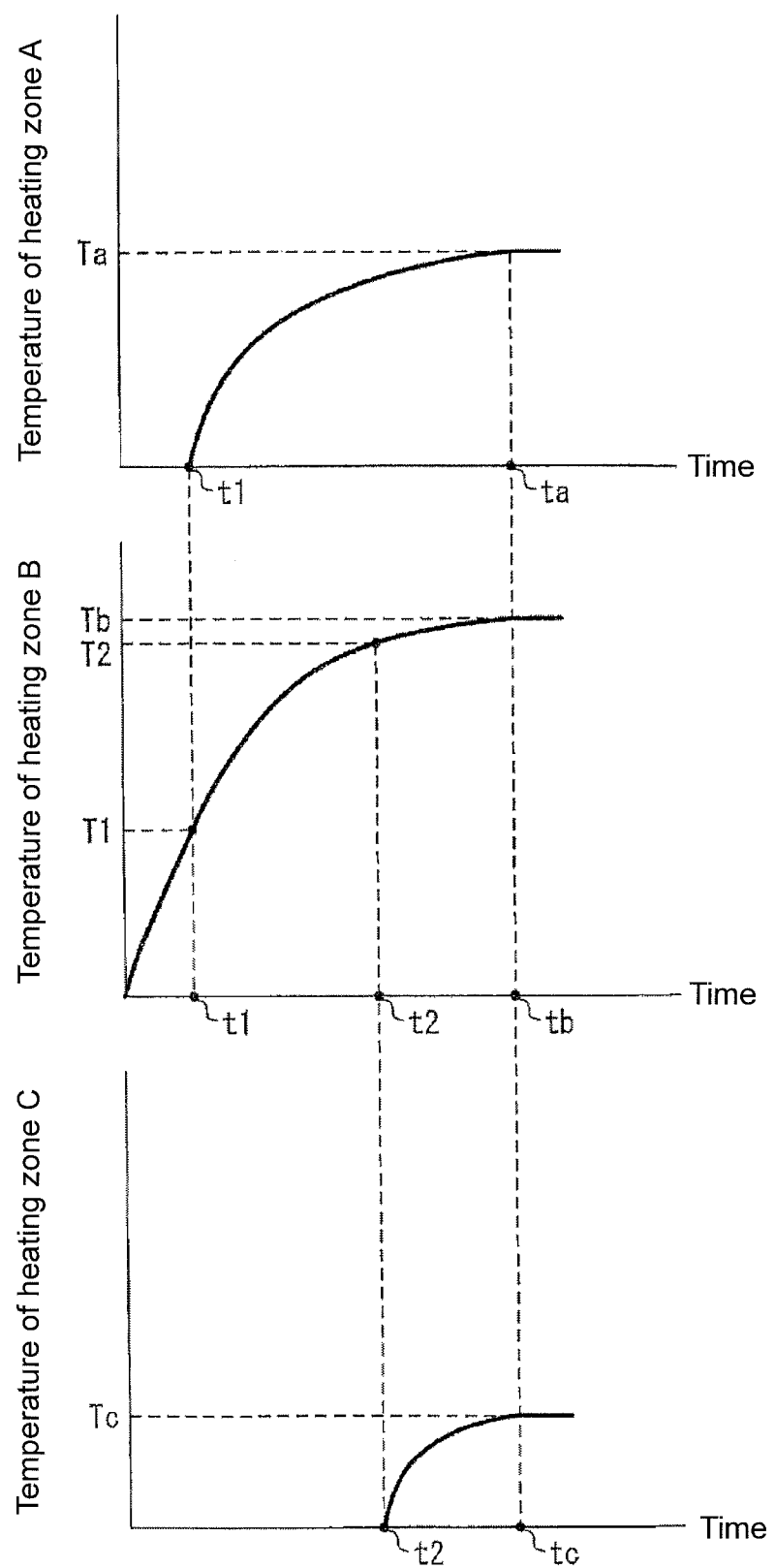
FIG. 6 shows graphs illustrating temperature changes of heating zones A to C in the first embodiment.

The heat-up starting time of the heating zone will be described below with reference to FIG. 6. FIG. 6 shows graphs illustrating a temperature change in each of the heating zones A to C of the first embodiment. In each of the graphs in FIG. 6, a horizontal axis indicates time, and a vertical axis indicates the temperature of each heating zone.

It is assumed that target temperatures of the heating zones A, B, and C are set to Ta, Tb, and Tc (Tc<Ta<Tb), respectively. It is assumed that the heating zone B has a longest time necessary for the heat-up from a room temperature state to the target temperature. It is assumed that the heat-up starting condition storage unit 22 stores the condition information illustrated in FIG. 5. It is assumed that a relationship of T1<T2<Tb holds for T1 and T2 in FIG. 5.

The temperature controller 14B is started up in the heating zone B having the longest time necessary for the heat-up from the room temperature state to the target temperature. The worker may start up the temperature controller 14B by directly operating the temperature controller 14B. Alternatively, the worker may input the instruction to the input device 40 to start up the heating zone B while watching the display device 30, and a signal indicating the start-up instruction may be output from the temperature controller control unit 24 to the temperature controller 14B of the heating zone B.

In the temperature controller 14B, the heater control unit 144 supplies the power to the heaters 13B1 and 13B2 to start the heat-up. The measured temperature acquisition unit 23 acquires the temperature of the heating zone B, which is measured by the temperature measurement unit 142, at predetermined time intervals (for example, 1 second).

The temperature controller control unit 24 recognizes that the reference zone of all the pieces of condition information is the heating zone B according to the condition information illustrated in FIG. 5, and determines whether the measured temperature, which is received by the measured temperature acquisition unit 23, of the heating zone B reaches the threshold indicated by the condition information.

It is assumed that the measured temperature of the heating zone B reaches a threshold T1 at a time point t1. At the time point t1, referring to the condition information of the identification number "1", the temperature controller control unit 24 determines that the heat-up target zone corresponding to the reference target zone "heating zone B" and the threshold "T1" is the "heating zone A", and outputs the signal indicating the start-up instruction to the temperature controller 14A of the heating zone A. When receiving the start-up instruction, the heater control unit 144 of the temperature controller 14A supplies the power to the heater 13A to start the heat-up of the heating zone A.

It is assumed that the measured temperature of the heating zone B reaches a threshold T2 at a time point t2. At the time point t2, referring to the condition information of the identification number "2", the temperature controller control unit 24 determines that the heat-up target zone corresponding to the reference target zone "heating zone B" and the threshold "T2" is the "heating zone C", and outputs the signal indicating the start-up instruction to the temperature controller 14C of the heating zone C. When receiving the start-up instruction, the heater control unit 144 of the temperature controller 14C supplies the power to the heater 13C to start the heat-up of the heating zone C.

Then, in each heating zone, the heater control unit 144 performs the heat-up until the measured temperature of the temperature measurement unit 142 reaches the target temperature, and the heater control unit 144 supplies the power to the heater such that the measured temperature is stabilized around the target temperature.

The condition information stored in the heat-up starting condition storage unit 22 is preset as follows. That is, a heat-up graph is produced indicating a relationship between an elapsed time since the heat-up starting and the temperature in the case that the heat-up of the heating zone B is performed by a normal heat-up operation (for example, the operation to start the heat-up from the room temperature state). On the other hand, the time (a heat-up time for zone A) is measured that is necessary to stabilize the heating zone A at the target temperature since the heat-up starting in the case that the heat-up of the heating zone A is performed by the normal heat-up operation (for example, the operation to start the heat-up from the room temperature state). Referring to the heat-up graph produced for the heating zone B, the temperature of the heating zone B at a time point going back by the heat-up time for zone A from a time point at which the heating zone B is stabilized at the target temperature is set to the threshold corresponding to the heat-up target zone "heating zone A". Similarly the threshold is set for the heating zone C.

As a result, because the heat-up is started in the heating zones A and C at each time point at which the measured temperature of the heating zone B reaches the corresponding threshold, times ta to tc at which the heating zones A to C are stabilized at the target temperatures are substantially identical as illustrated in FIG. 6, and wasted power consumption generated by waiting for the heat-up of other heating zones can be reduced.

According to the first embodiment, the generation of the wasted power consumption can be reduced even if the factor that fluctuates the heat-up time is generated due to the change of the surrounding environment (such as an external temperature) and the degradation of the heater performance. This point will be described below with reference to FIG. 7.

Figure 7:
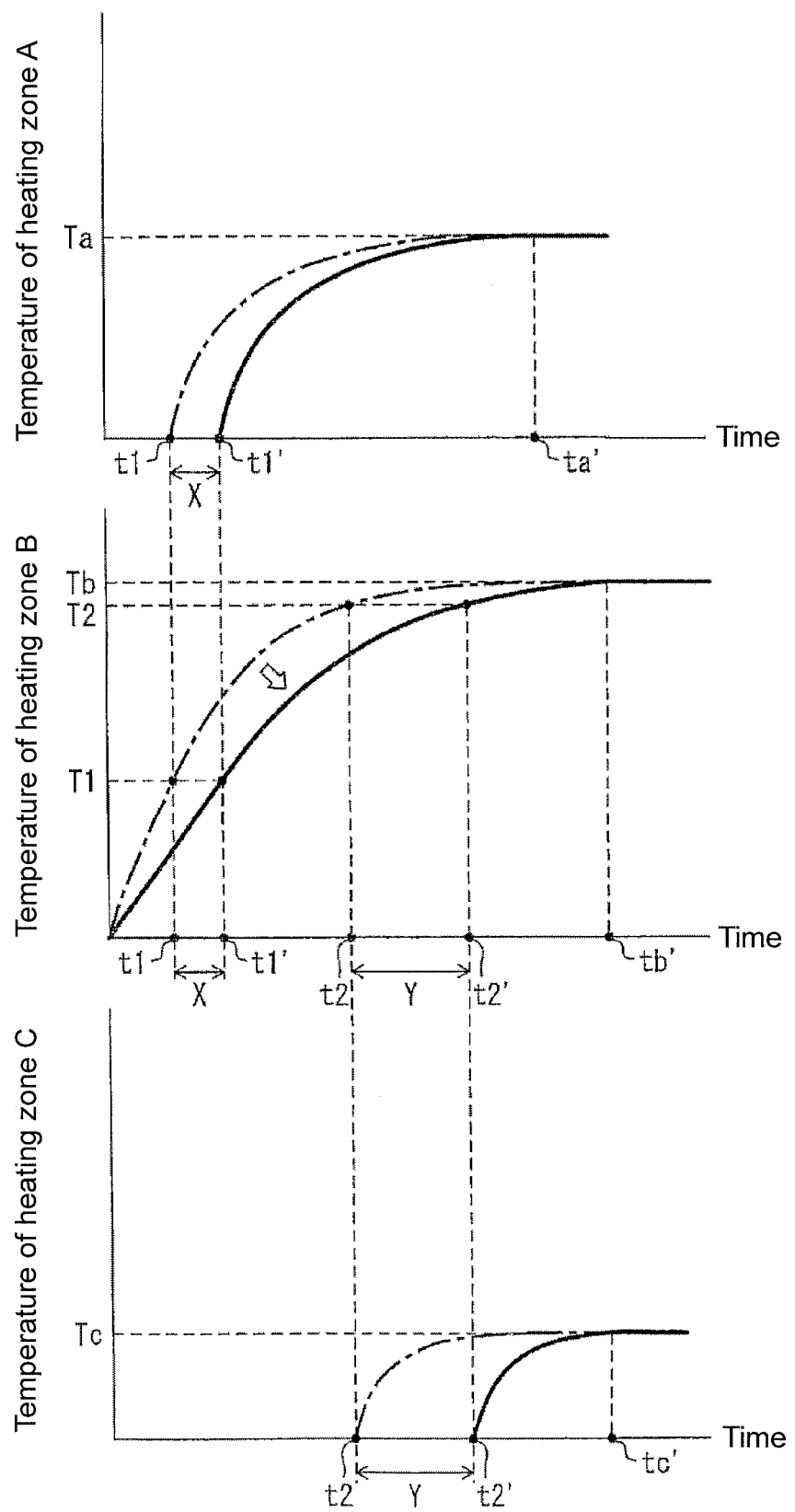
FIG. 7 shows graphs illustrating the temperature changes of the heating zones A to C when a heat-up time changes.

FIG. 7 shows graphs illustrating the heat-up starting times and the temperature changes of the heating zones A to C in two states having different heat-up times. In FIG. 7, a curve of an alternate long and short dash line indicates a state of the normal heat-up time, and a curve of a solid line indicates a state after the heat-up time is lengthened by the factor such as the change of the surrounding environment (such as the external temperature) and the degradation of the heater performance compared with the curve of the alternate long and short dash line.

In the first embodiment, the heat-up of the heating zones A and C that are of the heat-up target zone is started when the temperature of the heating zone B that is of the reference zone reaches the threshold. Therefore, even if the heat-up curve of the heating zone B that is of the reference zone changes from the state of the alternate long and short dash line to the state of the solid line, the heat-up starting times of the heating zones A and C that are of the heat-up target zone also changes according to the change of the heat-up curve of the heating zone B.

That is, as illustrated in FIG. 7, in the case that the heat-up curve of the heating zone B that is of the reference zone changes from the alternate long and short dash line to the solid line so as to lengthen the heat-up time, the heat-up starting time of the heating zone A is delayed from t1 to t1' by a time indicated by a symbol X. Similarly, the heat-up starting time of the heating zone C is delayed from t2 to t2' by a time indicated by a symbol Y. Therefore, the times the heating zones A and C that are of the heat-up target zone reach the target temperatures are delayed. As a result, the deviation among times ta', tb', and tc' at which the heating zones A to C reach the target temperatures can be decreased.

On the other hand, in the case that the heat-up starting time is determined by the time like in Patent Document 1, even if the heat-up curve of the heating zone B changes, the heat-up starting times of the heating zones A and C are kept constant at the times that deviate by predetermined times from the heat-up starting time of the heating zone B. Therefore, the deviation among the times the heating zones A to C reach the target temperatures increases.

As described above, according to the first embodiment, the generation of the wasted power consumption can be reduced even if the factor that fluctuates the heat-up time is generated due to the change of the surrounding environment (such as the external temperature) and the degradation of the heater performance.

In the first embodiment, when the temperature of the reference zone reaches the threshold, the temperature controller control unit 24 outputs the start-up instruction to the temperature controller of the heat-up target zone to start the heat-up. In a second embodiment, the heat-up is started by increasing the target temperature (the setting temperature). That is, the temperature controller control unit 24 outputs an instruction to the temperature controller of the heat-up target zone to change the target temperature, thereby starting the heat-up.

The second embodiment is the most appropriate mode in the case where the temperature of the heating zone is increased at the multiple steps. For example, in adjacent heating zones having the different final target temperatures, the heating zone (a high-temperature-side heating zone) having the higher target temperature is heated up at first, and the heating zone (a low-temperature-side heating zone) having the lower target temperature is heated up at the time the high-temperature-side heating zone comes close to the target temperature. In this case, because of a large temperature difference with the low-temperature-side heating zone in a heat-up process of the high-temperature-side heating zone, the heat escapes from the high-temperature-side heating zone to the low-temperature-side heating zone, and the high-temperature-side heating zone is not efficiently heated up. Therefore, an intermediate target temperature close to the final target temperature of the low-temperature-side heating zone is set with respect to the high-temperature-side heating zone. The low-temperature-side heating zone is heated up to the final target temperature while the high-temperature-side heating zone is heated up to the intermediate target temperature at an initial stage. Then, the high-temperature-side heating zone is heated up to the final target temperature when the low-temperature-side heating zone comes close to the target temperature. Therefore, at the initial stage, a quantity of heat escaping from the high-temperature-side heating zone to the low-temperature-side heating zone can be reduced to efficiently heat up the high-temperature-side heating zone.

In the case that it takes a long time for the workpiece to pass through the heating zone located on an upstream side of workpiece conveyance, sometimes the following processing is performed. The heating zone located on a downstream side is heated up to the intermediate target temperature while the upstream-side heating zone is stabilized at the target temperature, and the workpiece is put in the heating device. Then the downstream-side heating zone is heated up to the final target temperature while the workpiece passes through the upstream-side heating zone. Therefore, the power consumption can be reduced in the downstream-side heating zone.

In the second embodiment, the heat-up starting condition setting unit 21 stores information indicating target temperature change instruction condition including the reference zone, the threshold, the heat-up target zone, and the changed target temperature in addition to the start-up instruction condition including the reference zone, the threshold, and the heat-up target zone, as heat-up starting conditions.

FIG. 8 illustrates an example of the information stored in the heat-up starting condition storage unit 22 of the second embodiment. As illustrated in FIG. 8, the heat-up starting condition storage unit 22 stores the condition information of an identification number "3" correlated with the reference zone "heating zone A", a threshold "T3", the heat-up target zone "heating zone B", and a target temperature "Tb2" in addition to the pieces of condition information of the identification numbers "1" and "2" in FIG. 5. The pieces of condition information of the identification numbers "1" and "2" indicate the start-up instruction condition, and the condition information of the identification number "3" indicates the target temperature change instruction condition.

The temperature controller control unit 24 of the second embodiment includes the following function in addition to the function of the first embodiment. In the case that the condition information indicates the target temperature change instruction condition including the changed target temperature, the temperature controller control unit 24 outputs the change instruction to the temperature controller of the heat-up target zone indicated by the condition information to change the target temperature to the target temperature indicated by the condition information, when the measured temperature of the reference zone indicated by the condition information reaches the threshold.

Figure 9:
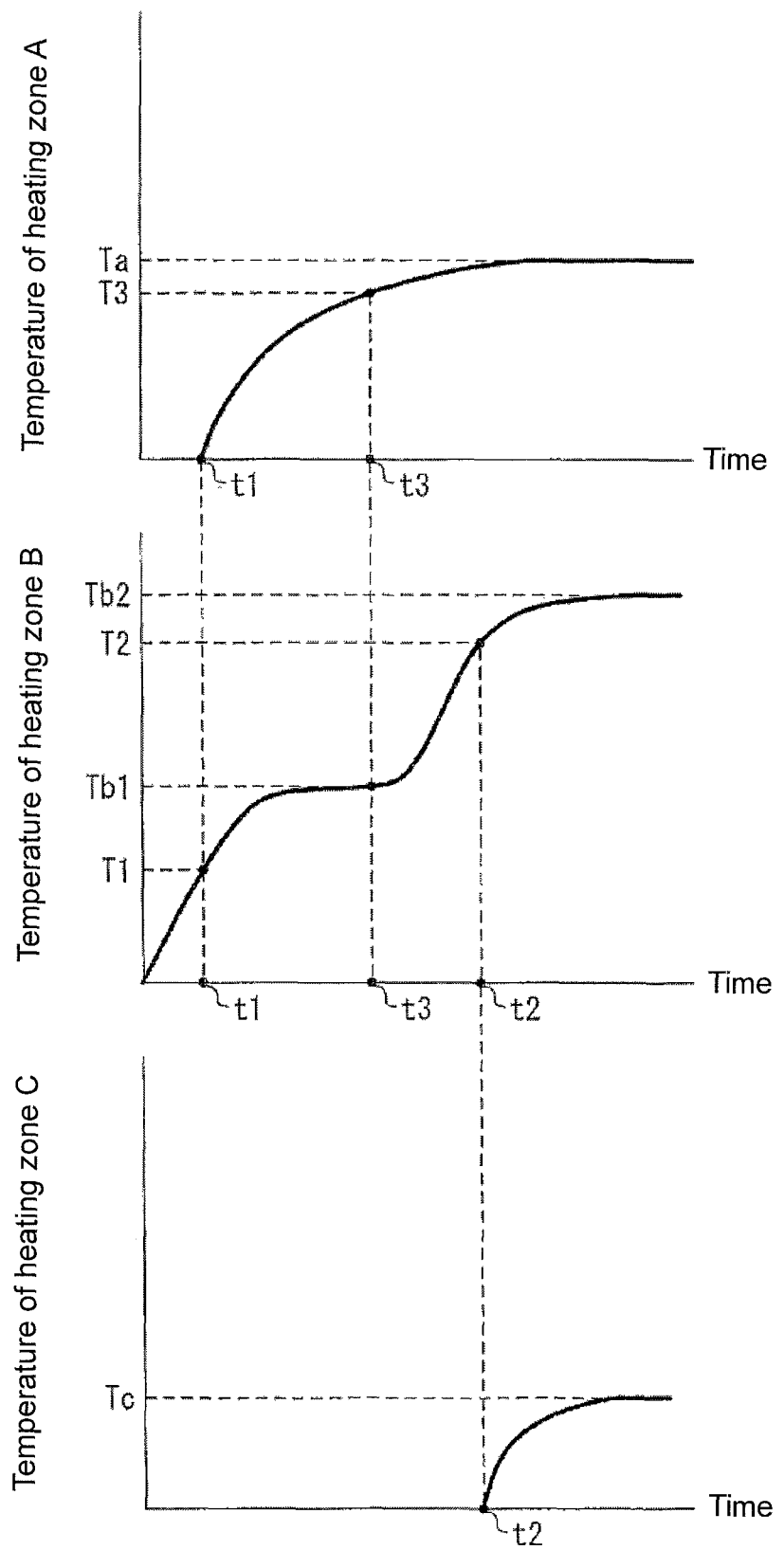
FIG. 9 shows graphs illustrating the temperature changes of the heating zones A to C in the second embodiment.

The heat-up starting time of the heating zone of the second embodiment will be described below with reference to FIG. 9. FIG. 9 shows graphs illustrating the temperature changes of the heating zones A to C of the second embodiment. In each graph of FIG. 9, the horizontal axis indicates the time and the vertical axis indicates the temperature of each heating zone.

It is assumed that the target temperatures of the heating zones A, B, and C are initially set to Ta, Tb1, and Tc (Tc<Ta<Tb1), respectively. It is assumed that Tb1 is the intermediate target temperature of the heating zone B, and Tb2 is the final target temperature. It is assumed that the heating zone B is higher than the heating zones A and C in the time necessary to perform the heat-up from the room temperature state to the final target temperature Tb2. It is assumed that the heat-up starting condition storage unit 22 stores the condition information illustrated in FIG. 8. It is assumed that a relationship of T1<T3<T2 holds among T1, T2, and T3 in FIG. 8.

First, the temperature controller 14B of the heating zone B having the longest time necessary to perform the heat-up from the room temperature state to the target temperature is started up.

In the temperature controller 14B, the heater control unit 144 supplies the power to the heaters 13B1 and 13B2 to start the heat-up to the temperature Tb1 set as the target temperature. The measured temperature acquisition unit 23 receives the temperature of the heating zone, which is measured by the temperature measurement unit 142, at predetermined time intervals (for example, 1 second).

The temperature controller control unit 24 recognizes that the heating zones A and B exist as the reference zone according to the condition information illustrated in FIG. 8, and determines whether the measured temperatures, which are received by the measured temperature acquisition unit 23, of the heating zones A and B reach the thresholds corresponding to the reference zone.

It is assumed that the measured temperature of the heating zone B reaches the threshold T1 at the time point t1. At the time point t1, referring to the condition information, the temperature controller control unit 24 determines that the heat-up target zone corresponding to the reference target zone "heating zone B" and the threshold "T1" is the "heating zone A", and outputs the signal indicating the start-up instruction to the temperature controller 14A of the heating zone A. When receiving the start-up instruction, the heater control unit 144 of the temperature controller 14A supplies the power to the heater 13A to start the heat-up of the heating zone A.

Then the heater control unit 144 of the temperature controller 14B continuously heats up the heating zone B, and stabilizes the heating zone B at the intermediate target temperature Tb1.

It is assumed that the measured temperature of the heating zone A reaches the threshold T3 at a time point t3. At the time point t3, referring to the condition information, the temperature controller control unit 24 determines that the heat-up target zone corresponding to the reference target zone "heating zone A" and the threshold "T3" is the "heating zone B", and that the target temperature "Tb2" is included. The temperature controller control unit 24 outputs the signal indicating the change instruction to change the target temperature to the determined target temperature "Tb2" to the temperature controller 14B of the heating zone B that is of the determined heat-up target zone. When receiving the change instruction, the target temperature setting unit 141 of the temperature controller 14B updates the target temperature. Therefore, the heater control unit 144 of the temperature controller 14B increases the amount of power supplied to the heaters 13B1 and 13B2 and starts the heat-up of the heating zone B such that the new target temperature is achieved.

It is assumed that the measured temperature of the heating zone B reaches the threshold T2 at the time point t2. At the time point t2, referring to the condition information, the temperature controller control unit 24 determines that the heat-up target zone corresponding to the reference target zone "heating zone B" and the threshold "T2" is the "heating zone C", and outputs the signal indicating the start-up instruction to the temperature controller 14C of the heating zone C. When receiving the start-up instruction, the heater control unit 144 of the temperature controller 14C supplies the power to the heater 13C to start the heat-up of the heating zone C.

Then, in each of the heating zones A to C, the heater control unit 144 continuously performs the heats-up until the measured temperature of the temperature measurement unit 142 reaches the target temperature, and supplies the power to the heater such that the measured temperature is stabilized around the target temperature.

According to the second embodiment, in heating up the heating zone B at multiple stages, the heat-up starting time from the intermediate stage is set to the time when the temperature of the heating zone A reaches the threshold. Therefore, even if the heat-up time of the heating zone A is fluctuated by some sort of factor, the heat-up starting time can be fluctuated according to the fluctuation amount until the final target temperature of the heating zone B is set. As a result, the generation of the wasted power consumption can be reduced compared with the conventional technology in which the heat-up starting time is fixed.

In the first and second embodiments, the threshold is kept constant unless the worker issues the instruction. In a third embodiment, the threshold is automatically updated according to the fluctuation of the heat-up time, and the generation of the wasted power consumption is further reduced.

The temperature controllers 14A to 14C of the third embodiment are identical those in FIG. 2. However, in the third embodiment, the measured temperature transmission unit 143 of each of the temperature controllers 14A to 14C transmits a measurement clock time to a control device 20' together with the measured temperature every time the temperature measurement unit 142 measures the temperature.

Figures 10, 11:
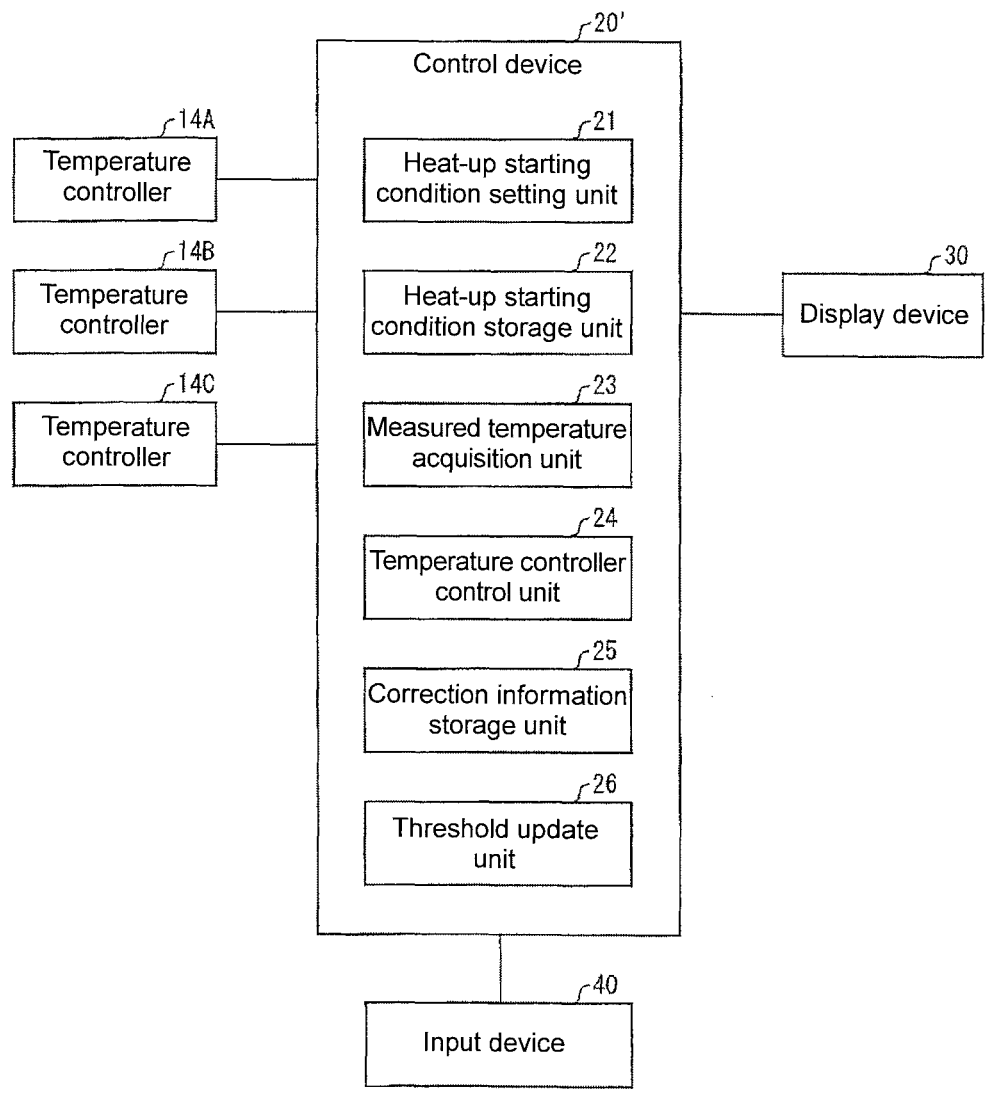
FIG. 10 is a block diagram illustrating a schematic configuration of a control device according to a third embodiment.
FIG. 11 illustrates an example the information stored in a correction information storage unit included in the control device of the third embodiment.

FIG. 10 is a block diagram illustrating a schematic configuration of a control device 20' of the third embodiment. As illustrated in FIG. 10, the control device 20' differs from the control device 20 in FIG. 4 in that the control device 20' includes a correction information storage unit 25 and a threshold update unit (threshold setting unit) 26. The measured temperature acquisition unit 23 acquires the measurement clock time together with the measured temperature.

The correction information storage unit 25 stores correction information that is of the information necessary to update the threshold. Specifically, the correction information storage unit 25 stores the correction information indicating the identification number identifying the condition information concerned, the reference zone identical to the condition information concerned, the heat-up target zone identical to the condition information concerned, the target temperature (the first setting temperature) set to the reference zone, and the target temperature (the second setting temperature) set to the heat-up target zone with respect to each piece of condition information stored in the heat-up starting condition storage unit. FIG. 11 illustrates an example the information stored in the correction information storage unit 25.

Based on the measured temperature and the measurement clock time, which are acquired by the measured temperature acquisition unit 23, and the correction information stored in the correction information storage unit 25, the threshold update unit 26 performs update processing of updating the threshold of the condition information stored in the heat-up starting condition storage unit 22. The threshold update unit 26 performs the update processing every time the heating device 10 is started up.

For every piece of correction information, the threshold update unit 26 determines that the time point at which the reference zone indicated by the correction information reaches the target temperature of the reference zone is a reference zone reaching time point based on the measured temperature and the measurement clock time, which are acquired by the measured temperature acquisition unit 23. In addition, for every piece of correction information, the threshold update unit 26 determines that the time point at which the heat-up target zone indicated by the correction information reaches the target temperature of the heat-up target zone is a heat-up target zone reaching time point. The threshold update unit 26 checks whether the reference zone reaching time point is earlier or later than the heat-up target zone reaching time point. The threshold update unit 26 may determine the reference zone reaching time point and the heat-up target zone reaching time point from the clock time or an elapsed time from a predetermined reference time. For example, it is conceivable that the time point at which the heating device is powered on or the time point at which the power is initially supplied to the heater of one of the heating zones is adopted as the predetermined reference time.

When the reference zone reaching time point is later than the heat-up target zone reaching time point, the threshold update unit 26 determines the measured temperature of the reference zone at the heat-up target zone reaching time point based on the measured temperature and the measurement clock time, which are acquired by the measured temperature acquisition unit 23. The threshold update unit 26 obtains a differential temperature ΔT between the determined measured temperature and the target temperature of the reference zone. The threshold update unit 26 updates the heat-up starting condition storage unit 22 with a value in which ΔT is added to the threshold of the corresponding condition information as the new threshold.

On the other hand, when the reference zone reaching time point is earlier than the heat-up target zone reaching time point, the threshold update unit 26 determines the measured temperature of the heat-up target zone at the reference zone reaching time point based on the measured temperature and the measurement clock time, which are acquired by the measured temperature acquisition unit 23. The threshold update unit 26 obtains the differential temperature ΔT between the determined measured temperature and the target temperature of the heat-up target zone. The threshold update unit 26 updates the heat-up starting condition storage unit 22 with the value in which ΔT is subtracted from the threshold of the corresponding condition information as the new threshold.

Figure 12:
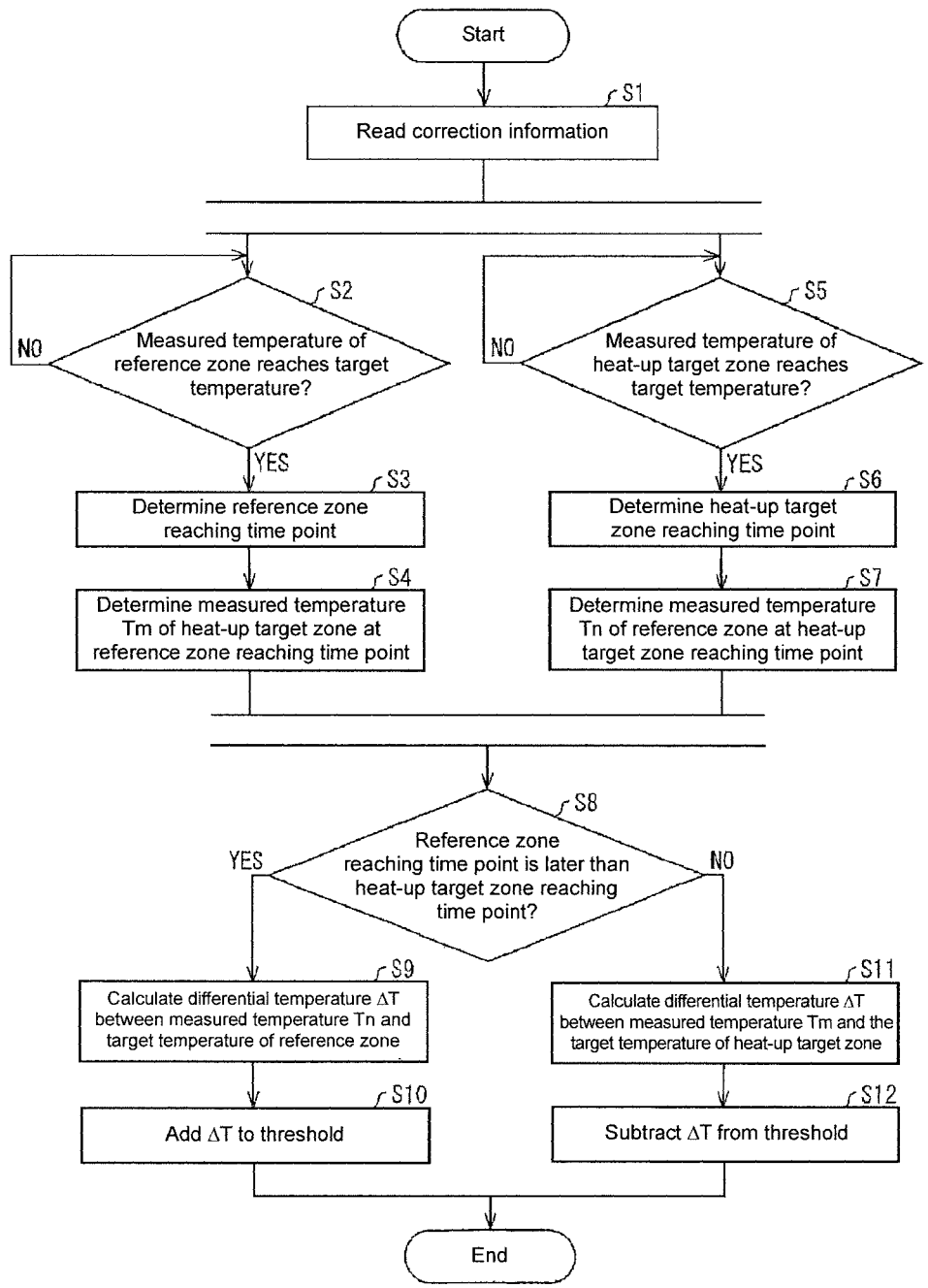
FIG. 12 is a flowchart illustrating a flow of threshold update processing in the third embodiment.

A flow of the update processing performed by the threshold update unit will be described below with reference to FIG. 12. FIG. 12 is a flowchart illustrating the flow of the update processing.

The threshold update unit 26 reads one of the pieces of correction information from the correction information storage unit 25, and extracts the reference zone, the target temperature of the reference zone, the heat-up target zone, and the target temperature of the heat-up target zone in the correction information concerned (S1).

Then the threshold update unit 26 checks the measured temperatures and the measurement clock times of the heating zones A to C, which are acquired by the measured temperature acquisition unit 23, and determines whether the measured temperature of the heating zone that is of the reference zone reaches the target temperature of the reference zone (S2). Because the determination processing performed by the threshold update unit 26 is similar to the reaching determination processing performed by the temperature controller control unit 24, the description is neglected. When the measured temperature of the reference zone does not reach the target temperature of the reference zone (No in S2), the threshold update unit 26 waits for the measured temperature of the reference zone to reach the target temperature of the reference zone.

When the measured temperature of the reference zone reaches the target temperature of the reference zone (Yes in S2), the threshold update unit 26 sets the measurement clock time corresponding to the measured temperature to the reference zone reaching time point (S3). At this point, the threshold update unit 26 determines the temperature measured in the heat-up target zone at the reference zone reaching time point (or within a predetermined range (for example, within a period of ±1 second) around the reference zone reaching time point) based on the measured temperature and the measurement clock time of the heat-up target zone, which are acquired by the measured temperature acquisition unit 23. The threshold update unit 26 sets the determined temperature to a measured temperature Tm of the heat-up target zone at the reference zone reaching time point (S4).

The following pieces of processing in S5 to S7 are performed in parallel with the pieces of processing in S2 to S4. In S5, the threshold update unit 26 checks the measured temperature and the measurement clock time of each heating zone, which are acquired by the measured temperature acquisition unit 23, and determines whether the measured temperature of the heat-up target zone reaches the target temperature of the heat-up target zone. The determination processing performed by the threshold update unit 26 is similar to the reaching determination processing performed by the temperature controller control unit 24. When the measured temperature of the heat-up target zone does not reach the target temperature of the heat-up target zone (No in S5), the threshold update unit 26 waits for the reaching of the measured temperature of the heat-up target zone at the target temperature of the heat-up target zone.

When the measured temperature of the heat-up target zone reaches the target temperature of the heat-up target zone (Yes in S5), the threshold update unit 26 sets the measurement clock time corresponding to the measured temperature to the heat-up target zone reaching time point (S6). At this point, the threshold update unit 26 determines the temperature measured in the reference zone at the heat-up target zone reaching time point (or within a predetermined range (for example, within a period of ±1 second) around the heat-up target zone reaching time point) based on the measured temperature and the measurement clock time of the reference zone, which are acquired by the measured temperature acquisition unit 23, and the threshold update unit 26 sets the determined temperature to a measured temperature Tn of the reference zone at the heat-up target zone reaching time point (S7).

Then the threshold update unit 26 checks whether the reference zone reaching time point is earlier or later than the heat-up target zone reaching time point (S8).

When the reference zone reaching time point is later than the heat-up target zone reaching time point (Yes in S8), the threshold update unit 26 obtains a differential temperature (the second temperature difference) ΔT between the measured temperature Tn of the reference zone and the target temperature of the reference zone at the heat-up target zone reaching time point determined in S7 (S9).

The threshold update unit 26 updates the heat-up starting condition storage unit 22 with the value in which ΔT is added to the threshold of the corresponding condition information as the new threshold (S10).

On the other hand, when the reference zone reaching time point is earlier than the heat-up target zone reaching time point (No in S8), the threshold update unit 26 obtains a differential temperature (the first temperature difference) ΔT between the measured temperature Tm of the heat-up target zone and the target temperature of the heat-up target zone at the reference zone reaching time point determined in S4 (S11).

The threshold update unit 26 updates the heat-up starting condition storage unit 22 with the value in which ΔT is subtracted from the threshold of the corresponding condition information as the new threshold (S12).

The threshold update unit 26 performs the update processing in FIG. 12 for every piece of correction information corresponding to identification information.

Figure 13B:
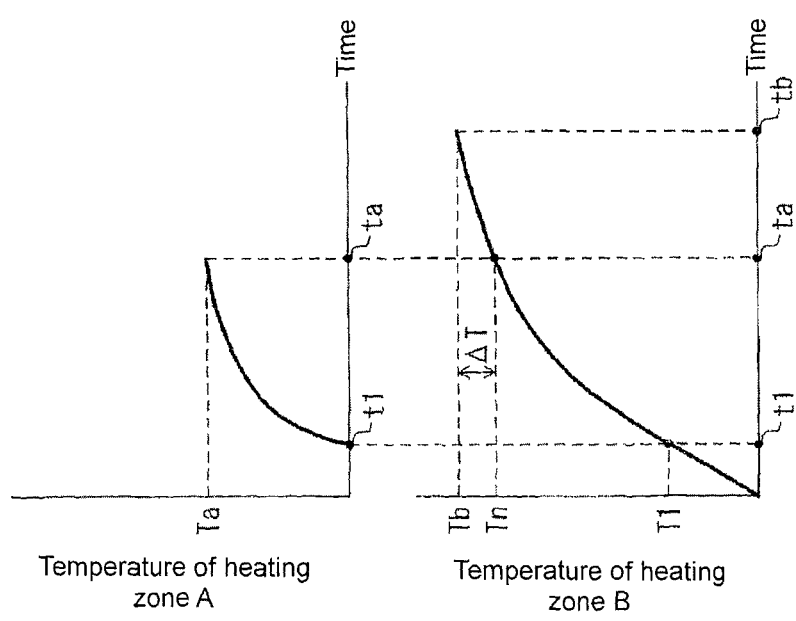
FIGS. 13(a) and 13(b) are graphs illustrating the temperature changes of heating zones A and B before and after the threshold update processing in the third embodiment.
Figure 13A:
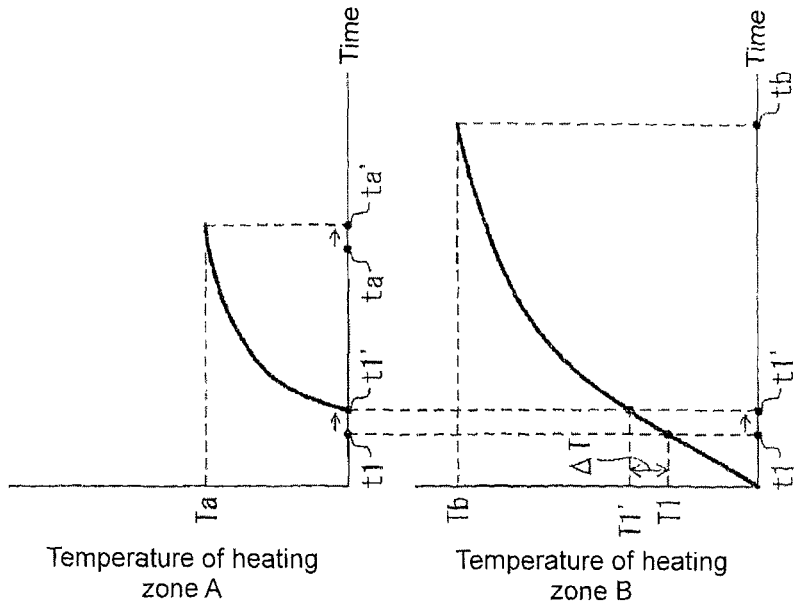
Figure 14B:
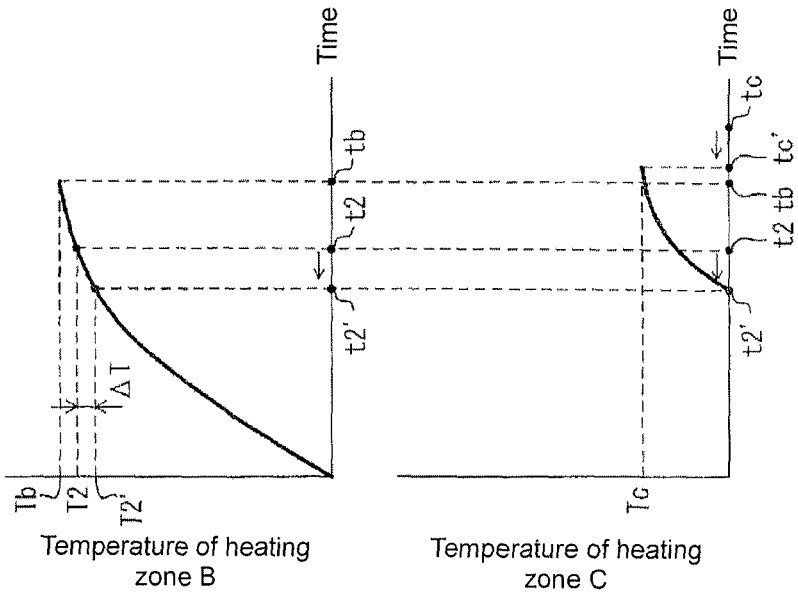
FIGS. 14(a) and 14(b) are graphs illustrating the temperature changes of heating zones B and C before and after the threshold update processing in the third embodiment.
Figure 14A:
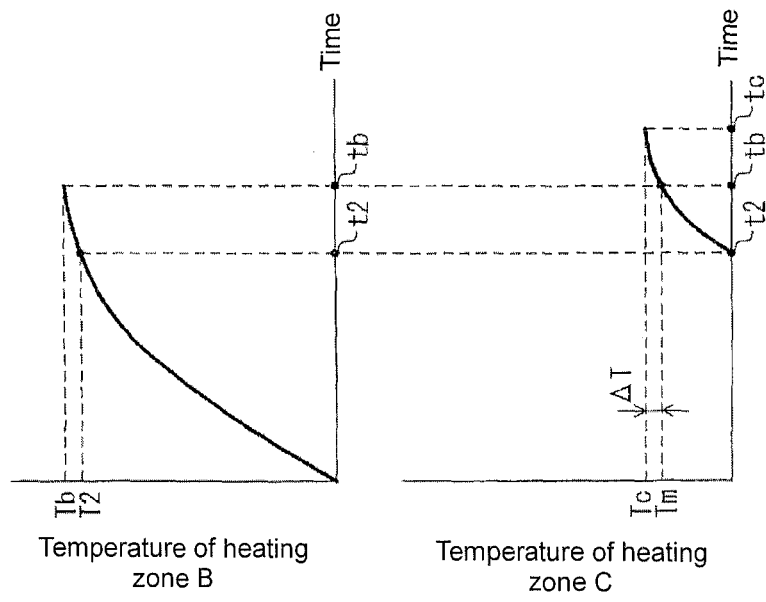

A specific correction example will be described below. FIGS. 13(a), 13(b), 14(a) and 14(b) are graphs illustrating the heat-up curve of each heating zone before and after the threshold update unit 26 performs the update processing. FIGS. 13(a) and 14(a) illustrate the pre-update processing heat-up curve, and FIGS. 13(b) and 14(b) illustrate post-update processing heat-up curve.

It is assumed that the heat-up starting condition storage unit 22 stores the condition information illustrated in FIG. 5 before the update processing. It is assumed that the correction information storage unit 25 stores the correction information illustrated in FIG. 11.

As illustrated in FIG. 13(*a*), at the time point t1 at which the measured temperature of the heating zone B that is of the reference zone reaches the threshold T1, the temperature controller control unit 24 starts the heat-up of the heating zone A that is of the heat-up target zone according to the condition information corresponding to the identification number "1". However, a heat-up target zone reaching time point ta that is of the time point at which the heating zone A reaches the target temperature is earlier than a reference zone reaching time point tb that is of the time point at which the heating zone B reaches the target temperature.

Therefore, the differential temperature $\Delta T$ between the measured temperature Tn of the heating zone B (the reference zone) and the target temperature Tb of the heating zone B is obtained at the heat-up target zone reaching time point ta. A new threshold T1' is set by adding $\Delta T$ to the threshold T1. Because the threshold T1' is set higher than the pre-update threshold T1, the heat-up starting time t1' of the heating zone A is delayed compared with the pre-update time t1. As a result, as illustrated in FIG. 13(*b*), deviation between a time point ta' at which the heating zone A reaches the target temperature Ta and the time point tb at which the heating zone B reaches the target temperature Tb decreases after the update processing. That is, the wasted power consumption, which is generated by waiting for another heating zone until reaching the target temperature, can be reduced.

As illustrated in FIG. 14(*a*), at the time point t2 at which the measured temperature of the heating zone B that is of the reference zone reaches the threshold T2, the temperature controller control unit 24 starts the heat-up of the heating zone C that is of the heat-up target zone according to the condition information corresponding to the identification number "2". However, a heat-up target zone reaching time point tc that is of the time point at which the heating zone C reaches the target temperature is later than the reference zone reaching time point tb that is of the time point at which the heating zone B reaches the target temperature.

Therefore, the differential temperature $\Delta T$ between the measured temperature Tm of the heating zone C (the heat-up target zone) and the target temperature Tc of the heating zone C is obtained at the reference zone reaching time point tb. A new threshold T2' is set by subtracting $\Delta T$ from the threshold T2. Because the threshold T2' is set lower than the pre-update threshold T2, the heat-up starting time t2' of the heating zone C is advanced compared with the pre-update time t2. As a result, as illustrated in FIG. 14(*b*), the deviation between a time point tc' at which the heating zone C reaches the target temperature Tc and the time point tb at which the heating zone B reaches the target temperature Tb decreases after the update processing. That is, the wasted power consumption, which is generated by waiting for another heating zone until reaching the target temperature, can be reduced.

According to the third embodiment, the worker may tentatively set the threshold from a certain level of experience when initially setting the threshold. This is because, every time the heating device 10 is started up, the threshold update unit 26 automatically updates the threshold based on the heat-up state of the previous heat-up starting control performed by the temperature controller control unit 24. The threshold is set by repeating pieces of the automatic update processing few times such that the times the heating zones reach the target temperatures are substantially identical to one another. As a result, the wasted power consumption, which is generated by waiting for another heating zone until reaching the target temperature, can be reduced.

In the third embodiment, the threshold update unit 26 obtains the new threshold by adding or subtracting the differential temperature $\Delta T$ between the measured temperature of the reference zone and the target temperature of the reference zone at the heat-up target zone reaching time point or the differential temperature $\Delta T$ between the measured temperature of the heat-up target zone and the target temperature of the heat-up target zone at the reference zone reaching time point to or from the threshold. In the update processing, the new threshold can be obtained by a relatively simple calculation when only the measured temperature of the heat-up target zone at the reference zone reaching time point or the measured temperature of the reference zone at the heat-up target zone reaching time point is stored. That is, according to one or more embodiments of the present invention, advantageously necessity of a troublesome program or a large-capacity memory is eliminated with respect to the threshold update processing. However, the times the heating zones reach the target temperatures cannot be necessarily made identical to one another through one piece of update processing.

Therefore, the threshold update unit 26 may perform the following update processing instead of the correction method of the third embodiment.

When the heating device 10 is started up, the threshold update unit 26 tentatively stores all the pieces of data of the measured temperature and the measurement clock time of the reference zone, which are acquired by the measured temperature acquisition unit 23, as heat-up curve information on the reference zone.

Similarly to the third embodiment, the threshold update unit 26 determines the reference zone reaching time point and the heat-up target zone reaching time point. The threshold update unit 26 obtains a time difference $\Delta t$ (>0) between the reference zone reaching time point and the heat-up target zone reaching time point, and checks whether the reference zone reaching time point is earlier or later than the heat-up target zone reaching time point.

The threshold update unit 26 determines the measurement clock time when the measured data of the reference zone reaches the threshold as the threshold reaching time point based on the heat-up curve information on the reference zone.

When the reference zone reaching time point is later than the heat-up target zone reaching time point, the threshold update unit 26 extracts the measured temperature corresponding to the measurement clock time, which is later than the threshold reaching time point by the time difference $\Delta t$, from the heat-up curve information on the reference zone. The threshold update unit 26 sets the extracted measured temperature to the new threshold.

When the reference zone reaching time point is earlier than the heat-up target zone reaching time point, the threshold update unit 26 extracts the measured temperature corresponding to the measurement clock time, which is earlier than the threshold reaching time point by the time difference $\Delta t$, from the heat-up curve information on the reference zone. The threshold update unit 26 sets the extracted measured temperature to the new threshold.

A specific correction example in the modification will be described below. FIGS. 15(*a*) and 15(*b*) are graphs illustrating the heat-up curve of each heating zone before and after the threshold update unit 26 performs the update processing.

FIG. 15(*a*) illustrates the pre-update processing heat-up curve, and FIG. 15(*b*) illustrates the post-update processing heat-up curve.

It is assumed that the heat-up starting condition storage unit 22 stores the condition information illustrated in FIG. 5 before the update processing. It is assumed that the correction information storage unit 25 stores the correction information illustrated in FIG. 11.

As illustrated in FIG. 15(*a*), at the threshold reaching time point when the measured temperature of the heating zone B that is of the reference zone reaches the threshold T1, the temperature controller control unit 24 starts the heat-up of the heating zone A that is of the heat-up target zone according to the condition information corresponding to the identification number "1". However, the heat-up target zone reaching time point that is of the time point at which the heating zone A reaches the target temperature Ta is earlier than the reference zone reaching time point tb that is of the time point at which the heating zone B reaches the target temperature.

Therefore, the measured temperature corresponding to the measurement clock time, which is later than the threshold reaching time point by the time difference $\Delta t$ between the heat-up target zone reaching time point and the reference zone reaching time point, is set to the new threshold. Therefore, as illustrated in FIG. 15(*b*), after the update processing, the time the heating zone A reaches the target temperature is delayed compared with before the update processing, and the time the heating zone A reaches the target temperature can substantially be equalized to the time the heating zone B reaches the target temperature. That is, the wasted power consumption, which is generated by waiting for another heating zone until reaching the target temperature, can be reduced.

Figure 16B:
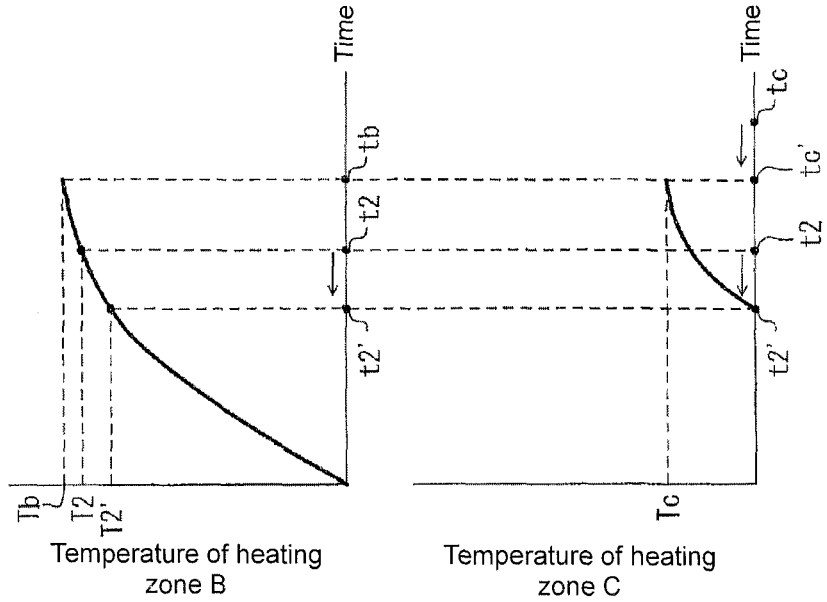
FIGS. 16(a) and 16(b) are graphs illustrating the temperature changes of heating zones B and C before and after the threshold update processing in the modification of the third embodiment.
Figure 16A:
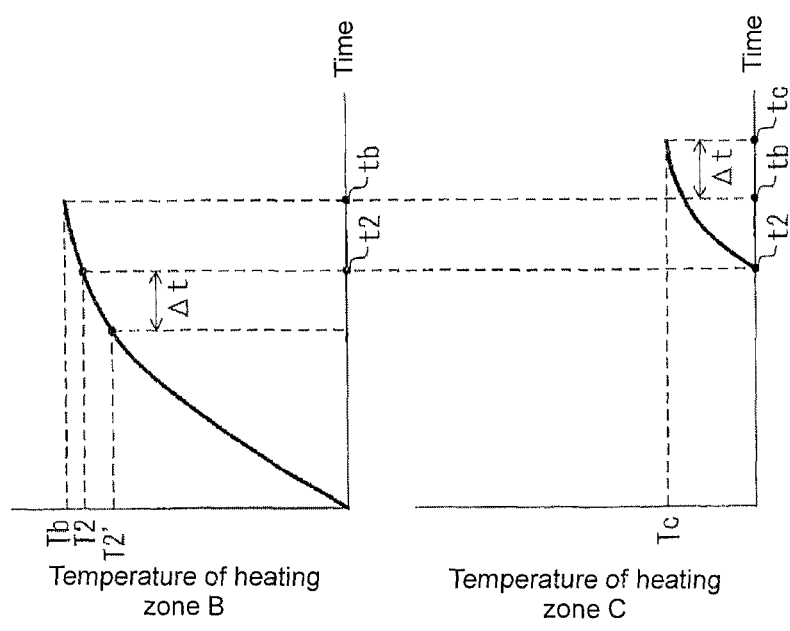

As illustrated in FIG. 16(*a*), at the threshold reaching clock time when the measured temperature of the heating zone B that is of the reference zone reaches the threshold, the temperature controller control unit 24 starts the heat-up of the heating zone C that is of the heat-up target zone according to the condition information corresponding to the identification number "2". However, the heat-up target zone reaching time point that is of the time point at which the heating zone C reaches the target temperature is later than the reference zone reaching time point that is of the time point at which the heating zone Breaches the target temperature.

Therefore, the measured temperature corresponding to the measurement clock time, which is earlier than the threshold reaching time point by the time difference $\Delta t$ between the heat-up target zone reaching time point and the reference zone reaching time point, is set to the new threshold. Therefore, as illustrated in FIG. 16(*b*), after the update processing, the time the heating zone C reaches the target temperature is advanced compared with before the update processing, and the time the heating zone C reaches the target temperature can substantially be equalized to the time the heating zone B reaches the target temperature. That is, the wasted power consumption, which is generated by waiting for another heating zone until reaching the target temperature, can be reduced.

According to the modification, although the memory in which the heat-up curve information on the reference zone is tentatively stored is necessary, the threshold can be automatically be set through one piece of update processing such that the times the heating zones reach the target temperatures are substantially identical to one another.

Figure 17:
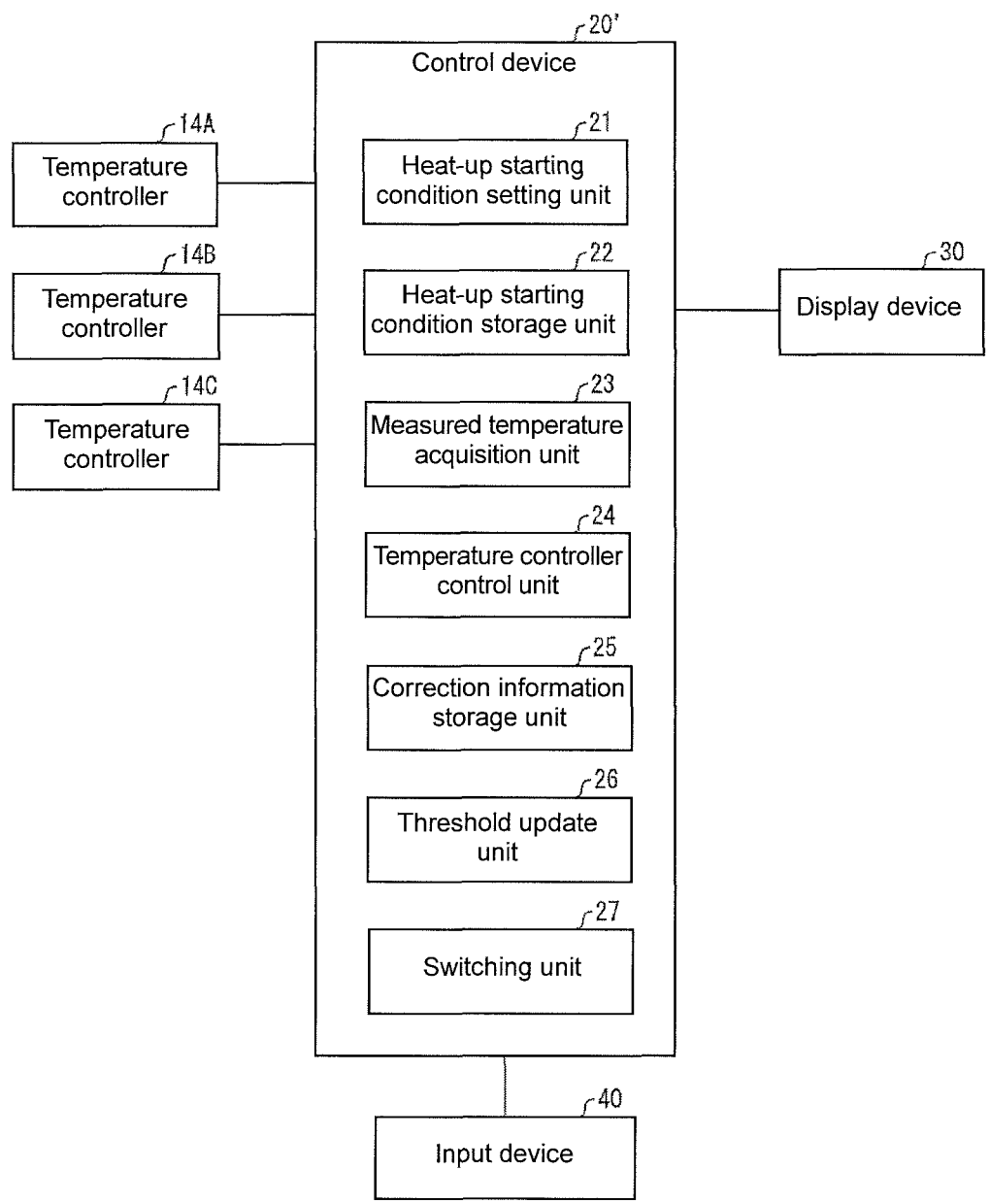
FIG. 17 is a block diagram illustrating a schematic configuration of a control device of the modification of the third embodiment.

In the third embodiment and the modification of third embodiment, the threshold update unit 26 performs the update processing every time the heating device 10 is started up. However, the present invention is not limited to such a manner. For example, as illustrated in FIG. 17, the control device 20 may include a switching unit 27 that performs switching processing of switching the function of the threshold update unit 26 between enable and disable. Therefore, the threshold update unit 26 can perform the update processing as needed basis, and the power consumed by the threshold update unit 26 can be reduced.

The switching unit 27 may perform the switching processing in response to the input instruction from the worker. In this case, the worker can start the update processing when determining that the update processing is required.

The switching unit 27 may be switched enable at predetermined constant intervals (for example, every week), and switched disable after one piece of update processing is ended.

Similarly to the threshold update unit 26, the switching unit 27 obtains the differential temperature $\Delta T$ or the time difference $\Delta t$, and the function of the threshold update unit 26 may be set enable in the case that the differential temperature $\Delta T$ or the time difference $\Delta t$ is greater than or equal to a predetermined value. In this case, the threshold can be corrected at a proper time when the deviation in the target temperature reaching time has increased.

According to the first to third embodiments and the modification, one or more of the following advantages (1) to (4) may be obtained.

(1) The wasted power consumption, which is generated when the heating zone having the shorter heat-up time waits for other heating zones until reaching the target temperatures, can be reduced compared with the case that all the heating zones A to C are simultaneously started to perform the heat-up.

(2) The time point at which the measured temperature of the reference zone reaches the threshold changes depending on the heat-up state of the reference zone.

(a) Therefore, the heat-up starting time of the heat-up target zone can be advanced even if the heat-up time of the reference zone is shortened because of the residual heat of the reference zone.

(b) Even if the heat-up time of each heating zone changes due to the change of the surrounding temperature in summer or winter, the heat-up starting time can be changed by reflecting the change of the heat-up time of each heating zone.

(c) In the case that the heat-up time is lengthened due to the degradation of the heater in the reference zone, the heat-up starting time of the heat-up target zone can be delayed by reflecting the lengthened heat-up time.

(d) In the case that the temperature of the reference zone does not reach the threshold due to a breakage of the heater, the heat-up of the heat-up target zone is not uselessly started.

Even if the factor that fluctuates the heat-up time is generated, the heat-up starting time of the heat-up target zone is also changed according to the fluctuation as described in the items (a) to (d). Therefore, the wasted power consumption can be reduced.

(3) According to the third embodiment, in the case that the deviation is generated among the reaching time points at which the heating zones reach the target temperatures, the differential temperature $\Delta T$ with the target temperature at the heat-up target zone reaching time point or the reference zone reaching time point is reflected on the next threshold. Therefore, the heat-up starting time of the heat-up target zone is automatically adjusted, and the reaching time points at which heating zones reach the target temperatures can fall within a small-difference range. As a result, the wasted power consumption can be reduced to the minimum level. In addition, by performing the start-up of the heating device 10 several times in initial threshold setting, the optimum threshold can automatically be set, and the threshold can simply be set.

The new threshold can be obtained by the relatively simple calculation only with the measured temperature of the heat-up target zone at the reference zone reaching time point being stored or only with the measured temperature of the reference zone at the heat-up target zone reaching time point being stored. That is, the necessity of the troublesome program or the large-capacity memory is eliminated with respect to the threshold update processing.

(4) According to the modification of the third embodiment, based on the time difference Δt between the reference zone reaching time point and the heat-up target zone reaching time point, the threshold is changed such that the reference zone reaching time point and the heat-up target zone reaching time point is identical to each other. Therefore, the optimum threshold can automatically be set.

The present invention is not limited to the above embodiments, but various changes can be made without departing from the scope of the present invention. An embodiment obtained by a proper combination of technical units disclosed in the different embodiments is also included in the technical scope of the present invention.

Each unit of the control devices 20 and 20' in one or more of the above embodiments can be constructed in such a manner that a calculation unit such as a CPU (Central Processing Unit) executes the program stored in a storage unit such as a ROM (Read Only Memory) and a RAM (Random Access Memory) and controls a communication unit such as a keyboard, an output unit such as a display, and a communication unit such as an interface circuit. Accordingly, a computer including these units may read a recording medium in which the program is recorded and execute the program, which allows various functions and various pieces of processing to be performed in the production line management devices of one or more of the above embodiments. The various functions and various pieces of processing can be performed on any computer by recording the program in a removable recording medium.

As to the recording medium, a memory (not illustrated) such as the ROM may be a program medium used to perform the processing using a microcomputer. Alternatively, although not illustrated, with a program reading provided as an external storage device, the program medium may be read by inserting the recording medium in the program reading device.

In each case, according to one or more embodiments of the present invention, the microprocessor accesses and executes the stored program. According to one or more embodiments of the present invention, the program is read, the read program is downloaded on the program storage area of the microcomputer, and the programs are executed. It is assumed that the program to be downloaded is previously stored in the device body.

The program medium is a recording medium configured to be able to separate from the main body, and is a recording medium configured to fixedly carry the program. Examples of the program medium includes a tape system such as a magnetic tape and a cassette tape, a disk system such as a magnetic disk including a flexible disk and a hard disk and a disk including a CD, an MO, an MD, and a DVD, a card system such as an IC card (including a memory card), and a semiconductor memory such as a mask ROM, an EPROM (Erasable Programmable Read Only Memory), an EEPROM (Electrically Erasable Programmable Read Only Memory), and a flash ROM.

According to one or more embodiments of the present invention, in the system configuration to which a communication network including the Internet can be connected, the program medium is a recording medium that carries the program in a floating manner such that the program is downloaded through the communication network.

According to one or more embodiments of the present invention, in the case that the program is downloaded through the communication network, the program to be downloaded is previously stored in a device body, or installed from another recording medium.

As described above, in a control device according to one or more embodiments of the present invention that controls a heating device including a plurality of heating zones, the control device includes: a monitoring unit configured to monitor a temperature of at least a first heating zone in the plurality of heating zones; and a control unit configured to perform heat-up starting control, in which heat-up of at least a second heating zone is started in the plurality of heating zones, based on the temperature of the first heating zone.

In a control method according to one or more embodiments of the present invention for controlling a heating device comprising a plurality of heating zones, the control method includes the steps of: monitoring a temperature of at least a first heating zone in the plurality of heating zones; and performing heat-up starting control, in which heat-up of at least a second heating zone is started in the plurality of heating zones, based on the temperature of the first heating zone.

According to the configuration, the heat-up of at least the second heating zone is started in the plurality of heating zones based on the temperature of the first heating zone. Even if the factor that fluctuates the heat-up time is generated in the first heating zone, the temperature of the first heating zone also fluctuates, so that the heat-up starting control of the second heating zone can be performed according to the fluctuation. As a result, the generation of the wasted power consumption can be reduced.

In the control device according to one or more embodiments of the present invention, the control unit may start the heat-up of the second heating zone as the heat-up starting control when the temperature of the first heating zone reaches a threshold.

According to the configuration, the heat-up of the second heating zone can be started by making the simple determination whether the temperature of the first heating zone reaches the threshold. For example, the control unit may determine that the temperature of the first heating zone reaches the threshold, when the temperature of the first heating zone is greater than or equal to the threshold, or when the temperature of the first heating zone indicates a predetermined range including the threshold.

The control device according to one or more embodiments of the present invention further includes a threshold setting unit configured to set the threshold. In the control device according to one or more embodiments of the present invention, the temperature of the first heating zone may be adjusted to a first setting temperature, the temperature of the second heating zone may be adjusted to a second setting temperature, and the threshold setting unit may update the threshold based on a first temperature difference or a second temperature difference in a previous heat-up starting control performed by the control unit, the first temperature difference being a temperature difference between a temperature of the second heating zone at a time when the first heating zone reaches the first setting temperature and the second setting temperature, the second temperature difference being a temperature difference between a temperature of the first heating zone at a time when the second heating zone reaches the second setting temperature and the first setting temperature.

For example, (1) when a time point at which the first heating zone reaches the first setting temperature is earlier than a time point at which the second heating zone reaches the second setting temperature in the previous heat-up starting control performed by the control unit, the threshold setting unit may update a value in which the first temperature difference is subtracted from the threshold as a new threshold, and (2) when a time point at which the second heating zone reaches the second setting temperature is earlier than a time point at which the first heating zone reaches the first setting temperature in the previous heat-up starting control performed by the control unit, the threshold setting unit may update a value in which the second temperature difference is added to the threshold as a new threshold.

According to the configuration, the value in which the first temperature difference is subtracted from the threshold is updated as the new threshold, when the time point at which the first heating zone reaches the first setting temperature is earlier than the time point at which the second heating zone reaches the second setting temperature. Therefore, the time the temperature of the first heating zone reaches the threshold becomes earlier after the update. As a result, the time point at which the first heating zone reaches the first setting temperature comes close to the time point at which the second heating zone reaches the second setting temperature, and the wasted power consumption, which is generated in the first heating zone until the second heating zone reaches the second setting temperature, can be reduced. Similarly, the value in which the second temperature difference is added to the threshold is updated as the new threshold, when the time point at which the second heating zone reaches the second setting temperature is earlier than the time point at which the first heating zone reaches the first setting temperature. Therefore, the time the temperature of the first heating zone reaches the threshold becomes later after the update. As a result, the time point at which the second heating zone reaches the second setting temperature comes close to the time point at which the first heating zone reaches the first setting temperature, and the wasted power consumption, which is generated in the second heating zone until the first heating zone reaches the first setting temperature, can be reduced.

The control device further includes a threshold setting unit configured to set the threshold. In the control device according to one or more embodiments of the present invention, the temperature of the first heating zone may be adjusted to a first setting temperature, the temperature of the second heating zone may be adjusted to a second setting temperature, and the threshold setting unit may update the threshold based on a time difference between a time point at which the first heating zone reaches the first setting temperature and a time point at which the second heating zone reaches the second setting temperature in a previous heat-up starting control performed by the control unit.

For example, the threshold setting unit may store heat-up curve information indicating a time change in temperature of the first heating zone in the previous heat-up starting control performed by the control unit, (1) when a time point at which the first heating zone reaches the first setting temperature is earlier than a time point at which the second heating zone reaches the second setting temperature in the previous heat-up starting control performed by the control unit, the threshold setting unit may determine a temperature of the first heating zone at a time point, which is earlier than a time point at which the first heating zone reaches the threshold by the time difference, from the heat-up curve and update the determined temperature as a new threshold, and (2) when a time point at which the second heating zone reaches the second setting temperature is earlier than a time point at which the first heating zone reaches the first setting temperature in the previous heat-up starting control performed by the control unit, the threshold setting unit may determine a temperature of the first heating zone at a time point, which is later than a time point at which the first heating zone reaches the threshold by the time difference, from the heat-up curve and update the determined temperature as a new threshold.

According to the configuration, the temperature of the first heating zone at the time point, which is earlier than the time point at which the first heating zone reaches the threshold by the time difference, is used as the new threshold, when the time point at which the first heating zone reaches the first setting temperature is earlier than a time point at which the second heating zone reaches the second setting temperature. Therefore, the time the temperature of the first heating zone reaches the threshold becomes earlier by the time difference after the update. As a result, the time point at which the first heating zone reaches the first setting temperature is substantially identical to the time point at which the second heating zone reaches the second setting temperature, and the wasted power consumption, which is generated in the first heating zone until the second heating zone reaches the second setting temperature, can be reduced. Similarly, the temperature of the first heating zone at the time point, which is later than the time point at which the first heating zone reaches the threshold by the time difference, is used as the new threshold, when the time point at which the second heating zone reaches the second setting temperature is earlier than a time point at which the first heating zone reaches the first setting temperature. Therefore, the time the temperature of the first heating zone reaches the threshold becomes later by the time difference after the update. As a result, the time point at which the second heating zone reaches the second setting temperature is substantially identical to the time point at which the first heating zone reaches the first setting temperature, and the wasted power consumption, which is generated in the second heating zone until the first heating zone reaches the first setting temperature can be reduced.

In the control device according to one or more embodiments of the present invention, the threshold setting unit may update the threshold every time the control unit performs the heat-up starting control. Therefore, the threshold can always be updated to the optimum value.

Alternatively, in the control device according to one or more embodiments of the present invention, the threshold setting unit may update the threshold only when the first temperature difference or the second temperature difference is greater than or equal to a predetermined value in the previous heat-up starting control performed by the control unit. Alternatively, the threshold setting unit may update the threshold only when the time difference is greater than or equal to a predetermined value in the previous heat-up starting control performed by the control unit. Therefore, the threshold can be updated only in the case that the time the temperature reaches the setting temperature deviates largely. As a result, the useless processing of updating the threshold can be eliminated.

The control unit may start the heat-up of the second heating zone as the heat-up starting control by switching from off to on a power supply to a heater installed in the second heating zone.

Alternatively, the control unit may increase the second setting temperature to start the heat-up of the second heating zone as the heat-up starting control, in a state in which the temperature of the second heating zone is adjusted to the second setting temperature by controlling power supplied to a heater installed in the second heating zone. According to the configuration, the heat-up of the second heating zone can be performed at multiple stages.

The heating device may be a reflow device that mounts an electronic component on a printed circuit board.

A heating device control system according to one or more embodiments of the present invention includes: a heating device comprising a plurality of heating zones; and the control device configured to control the heating device. Therefore, the generation of the wasted power consumption can be reduced even if the factor that fluctuates the heat-up time is generated in the heating device in which the heat-up starting time is set in each heating zone.

Additionally, the control device may be constructed by a computer. In this case, a program configured to cause the computer to act as each unit of the control device and a computer-readable recording medium in which the program is recorded are also included in the scope of the present invention.

One or more embodiments of the present invention can be applied to the device that controls the heating device including the plurality of heating zones. Examples of the heating device include the reflow device, baking device, and the drying device, which are installed in the production line.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 1 heating device control system
10 heating device
13A, 13B1, 13B2, 13C heater
14A, 14B, 14C temperature controller
20, 20' control device
21 heat-up starting condition setting unit (threshold setting unit)
22 heat-up starting condition storage unit
23 measured temperature acquisition unit (monitoring unit)
24 temperature controller control unit (control unit)
25 correction information storage unit
26 threshold update unit (threshold setting unit)
A, B, C heating zone

The invention claimed is:

1. A control device that controls a heating device comprising a plurality of heating zones, the control device comprising:
a monitoring unit configured to monitor a temperature of at least a first heating zone in the plurality of heating zones;
a control unit configured to perform heat-up starting control, in which heat-up of at least a second heating zone is started in the plurality of heating zones, based on the temperature of the first heating zone,
wherein the control unit starts the heat-up of the second heating zone as the heat-up starting control when the temperature of the first heating zone reaches a threshold; and
a threshold setting unit configured to set the threshold,
wherein the temperature of the first heating zone is adjusted to a first setting temperature,
wherein the temperature of the second heating zone is adjusted to a second setting temperature,
wherein the threshold setting unit updates the threshold based on a first temperature difference or a second temperature difference in a previous heat-up starting control performed by the control unit,
wherein the first temperature difference is a temperature difference between a temperature of the second heating zone at a time when the first heating zone reaches the first setting temperature and the second setting temperature, and
wherein the second temperature difference is a temperature difference between a temperature of the first heating zone at a time when the second heating zone reaches the second setting temperature and the first setting temperature.

2. The control device according to claim 1,
wherein, when a first time point at which the first heating zone reaches the first setting temperature is earlier than a second time point at which the second heating zone reaches the second setting temperature in the previous heat-up starting control performed by the control unit, the threshold setting unit updates a value in which the first temperature difference is subtracted from the threshold as a new threshold, and
wherein, when the second time point at which the second heating zone reaches the second setting temperature is earlier than the first time point at which the first heating zone reaches the first setting temperature in the previous heat-up starting control performed by the control unit, the threshold setting unit updates a value in which the second temperature difference is added to the threshold as a new threshold.

3. The control device according to claim 2, wherein the threshold setting unit updates the threshold every time the control unit performs the heat-up starting control.

4. The control device according to claim 2, wherein the threshold setting unit updates the threshold only when the first temperature difference or the second temperature difference is greater than or equal to a predetermined value in the previous heat-up starting control performed by the control unit.

5. The control device according to claim 1, wherein the threshold setting unit updates the threshold every time the control unit performs the heat-up starting control.

6. The control device according to claim 1, wherein the threshold setting unit updates the threshold only when the first temperature difference or the second temperature difference is greater than or equal to a predetermined value in the previous heat-up starting control performed by the control unit.

7. The control device according to claim 1, wherein the control unit starts the heat-up of the second heating zone as the heat-up starting control by switching from off to on a power supply to a heater installed in the second heating zone.

8. The control device according to claim 1, wherein the control unit increases the second setting temperature to start the heat-up of the second heating zone as the heat-up starting control, in a state in which the temperature of the second heating zone is adjusted to the second setting temperature by controlling power supplied to a heater installed in the second heating zone.

9. The control device according to claim 1, wherein the control unit determines that the temperature of the first heating zone reaches the threshold, when the temperature of the first heating zone is greater than or equal to the threshold, or when the temperature of the first heating zone indicates a predetermined range including the threshold.

10. The control device according to claim 1, wherein the heating device is a reflow device that mounts an electronic component on a printed circuit board.

11. A heating device control system comprising:
a heating device comprising a plurality of heating zones; and
the control device according to claim 1 configured to control the heating device.

12. A control device that controls a heating device comprising a plurality of heating zones, the control device comprising:
a monitoring unit configured to monitor a temperature of at least a first heating zone in the plurality of heating zones;
a control unit configured to perform heat-up starting control, in which heat-up of at least a second heating zone is started in the plurality of heating zones, based on the temperature of the first heating zone,
wherein the control unit starts the heat-up of the second heating zone as the heat-up starting control when the temperature of the first heating zone reaches a threshold; and
a threshold setting unit configured to set the threshold,
wherein the temperature of the first heating zone is adjusted to a first setting temperature,
wherein the temperature of the second heating zone is adjusted to a second setting temperature, and
wherein the threshold setting unit updates the threshold based on a time difference between a first time point at which the first heating zone reaches the first setting temperature and a second time point at which the second heating zone reaches the second setting temperature in a previous heat-up starting control performed by the control unit.

13. The control device according to claim 12,
wherein the threshold setting unit stores heat-up curve information indicating a time change in temperature of the first heating zone in the previous heat-up starting control performed by the control unit,
wherein, when the first time point at which the first heating zone reaches the first setting temperature is earlier than the second time point at which the second heating zone reaches the second setting temperature in the previous heat-up starting control performed by the control unit, the threshold setting unit determines a temperature of the first heating zone at a third time point, which is earlier than a time point at which the first heating zone reaches the threshold by the time difference, from the heat-up curve and updates the determined temperature as a new threshold, and
wherein, when the second time point at which the second heating zone reaches the second setting temperature is earlier than the first time point at which the first heating zone reaches the first setting temperature in the previous heat-up starting control performed by the control unit, the threshold setting unit determines a temperature of the first heating zone at a fourth time point, which is later than a time point at which the first heating zone reaches the threshold by the time difference, from the heat-up curve and updates the determined temperature as a new threshold.

14. The control device according to claim 13, wherein the threshold setting unit updates the threshold every time the control unit performs the heat-up starting control.

15. The control device according to claim 12, wherein the threshold setting unit updates the threshold only when the time difference is greater than or equal to a predetermined value in the previous heat-up starting control performed by the control unit.

16. The control device according to claim 12, wherein the threshold setting unit updates the threshold every time the control unit performs the heat-up starting control.

17. A control method for controlling a heating device comprising a plurality of heating zones, the control method comprising:
monitoring a temperature of at least a first heating zone in the plurality of heating zones;
performing heat-up starting control, in which heat-up of at least a second heating zone is started in the plurality of heating zones, based on the temperature of the first heating zone,
wherein the heat-up of the second heating zone is started as the heat-up starting control when the temperature of the first heating zone reaches a threshold;
setting the threshold;
adjusting the temperature of the first heating zone to a first setting temperature;
adjusting the temperature of the second heating zone to a second setting temperature; and
updating the threshold based on a first temperature difference or a second temperature difference in a previous heat-up starting control,
wherein the first temperature difference is a temperature difference between a temperature of the second heating zone at a time when the first heating zone reaches the first setting temperature and the second setting temperature, and
wherein the second temperature difference is a temperature difference between a temperature of the first heating zone at a time when the second heating zone reaches the second setting temperature and the first setting temperature.

18. A program stored on a non-transitory computer readable medium, configured to control a heating device comprising a plurality of heating zones, the program causing a computer to perform:
monitoring a temperature of at least a first heating zone in the plurality of heating zones;
performing heat-up starting control, in which heat-up of at least a second heating zone is started in the plurality of heating zones, based on the temperature of the first heating zone,
wherein the heat-up of the second heating zone is started as the heat-up starting control when the temperature of the first heating zone reaches a threshold;
setting the threshold;
adjusting the temperature of the first heating zone to a first setting temperature;

adjusting the temperature of the second heating zone to a second setting temperature; and updating the threshold based on a first temperature difference or a second temperature difference in a previous heat-up starting control, wherein the first temperature difference is a temperature difference between a temperature of the second heating zone at a time when the first heating zone reaches the first setting temperature and the second setting temperature, and wherein the second temperature difference is a temperature difference between a temperature of the first heating zone at a time when the second heating zone reaches the second setting temperature and the first setting temperature.

* * * * *